(12) United States Patent
Kurita

(10) Patent No.: US 8,383,524 B2
(45) Date of Patent: Feb. 26, 2013

(54) SEMICONDUCTOR DEVICE MANUFACTURING METHOD

(75) Inventor: Takaki Kurita, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 161 days.

(21) Appl. No.: 13/053,898

(22) Filed: Mar. 22, 2011

(65) Prior Publication Data
US 2011/0275225 A1 Nov. 10, 2011

(30) Foreign Application Priority Data

May 10, 2010 (JP) ................... 2010-108111

(51) Int. Cl.
H01L 21/31 (2006.01)
(52) U.S. Cl. .................. 438/761; 257/E21.24
(58) Field of Classification Search .......... None
See application file for complete search history.

(56) References Cited

U.S. PATENT DOCUMENTS 7,994,002 B2 * 8/2011 Chang et al. .................. 438/243
8,268,684 B2 * 9/2012 Chang et al. .................. 438/243

FOREIGN PATENT DOCUMENTS

JP 5-190540 A 7/1993
JP 7-106325 A 4/1995

* cited by examiner

Primary Examiner — Seahvosh Nikmanesh
(74) Attorney, Agent, or Firm — Westerman, Hattori, Daniels & Adrian, LLP

(57) ABSTRACT

A semiconductor device manufacturing method includes forming a transistor over a semiconductor substrate; forming a first silicon nitride film covering the transistor over the semiconductor substrate; supplying a $NH_4F$ radical to the first silicon nitride film; making thermal processing on the first silicon nitride film after the supplying the $NH_4F$ radical; and forming a second silicon nitride film over the first silicon nitride film after the thermal processing.

11 Claims, 40 Drawing Sheets

US 8,383,524 B2

SEMICONDUCTOR DEVICE MANUFACTURING METHOD

CROSS-REFERENCE TO RELATED APPLICATION

This application is based upon and claims the benefit of priority of the prior Japanese Patent Application No. 2010-108111, filed on May 10, 2010, the entire contents of which are incorporated herein by reference.

FIELD

The embodiments discussed herein are related to a semiconductor device manufacturing method.

BACKGROUND

Recently, as a method for increasing carrier mobilities of transistors, it is proposed to apply tensile stresses or compressive stresses to the channel regions of the transistors.

For NMOS transistors, a tensile stress film, which applies tensile stresses to the channel region of the NMOS transistors, is formed, covering the NMOS transistors.

For PMOS transistors, a compressive stress film, which applies compressive stresses to the channel regions of the PMOS transistors, is formed, covering the PMOS transistors.

As a material of the tensile stress film and the compressive stress film, silicon nitride film is used.

Related reference is as follows:
Japanese Laid-open Patent Publication No. Hei 7-106325; and
Japanese Laid-open Patent Publication No. Hei 5-190540.

SUMMARY

According to one aspect of an embodiment, a semiconductor device manufacturing method includes forming a transistor over a semiconductor substrate; forming a first silicon nitride film covering the transistor over the semiconductor substrate; supplying a $NH_4F$ radical to the first silicon nitride film; making thermal processing on the first silicon nitride film after the supplying the $NH_4F$ radical; and forming a second silicon nitride film over the first silicon nitride film after the thermal processing.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

In the proposed semiconductor devices, stress film of good quality cannot be necessarily formed.

The semiconductor device manufacturing method according to a reference will be described with reference to FIGS. 39A to 40B. FIGS. 39A to 40B are cross-sectional views of a semiconductor device in the steps of the semiconductor device manufacturing method according to the reference.

Figure 39A:
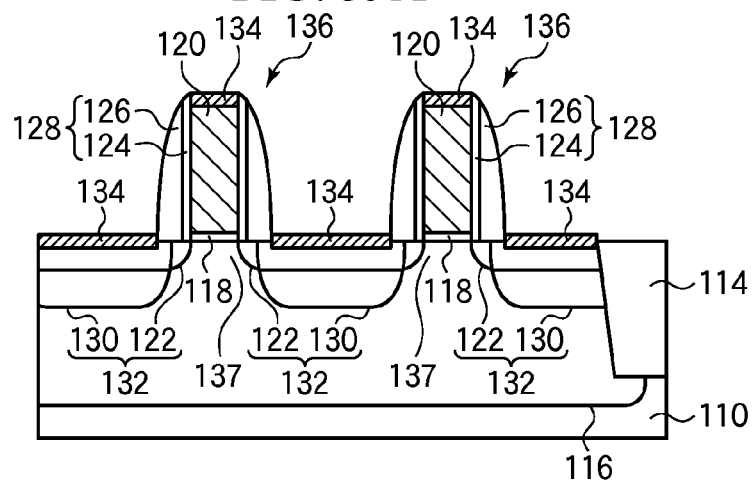
FIGS. 39A to 40B are cross-sectional views of a semiconductor device in the steps of the semiconductor device manufacturing method according to a Reference, which illustrate the method.
Figure 39B:
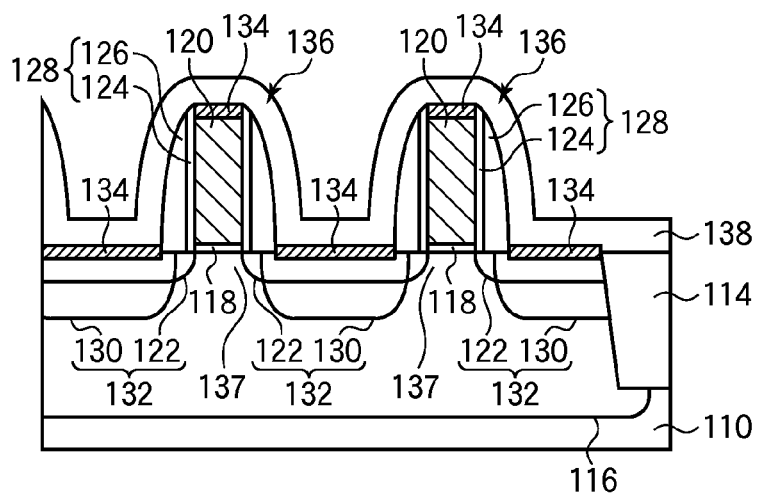

First, device isolation regions 114 for defining device regions is formed on a semiconductor substrate 110 by STI (Shallow Trench Isolation (see FIG. 39A). Then, wells 116 are formed in the semiconductor substrate 110 by ion implantation. Then, gate electrodes 120 are formed with a gate insulation film 118 formed therebetween. Next, with the gate electrodes 120 as the mask, extension regions 122 are formed in the semiconductor substrate 110 on both sides of each gate electrode 120 by ion implantation. Next, on the side walls of the gate electrodes 120, a sidewall insulation film 128 of the layer structure of a silicon oxide film 124 and a silicon nitride film 126 is formed. Then, with the gate electrodes 120 and the sidewall insulation film 128 as the mask, deep impurity diffused regions 130 are formed by ion implantation. The source/drain diffused layers 132 of the extension source/drain structure are formed by the extension regions 122 and the impurity diffused regions 130. Next, a silicide film 134 is formed on the source/drain diffused layers 132 and the gate electrodes 120. Thus, transistors 136 each including the gate electrode 120 and the source/drain diffused layer 132 are formed.

Then, on the entire surface, a silicon nitride film 138 is formed by CVD (Chemical Vapor Deposition) (see FIG. 39B) The silicon nitride film 138 functions together with silicon nitride films 140, 142, 144 to be formed in later steps as a stress film which applies stresses to the channel regions 137 of the transistors 136.

Figure 39C:
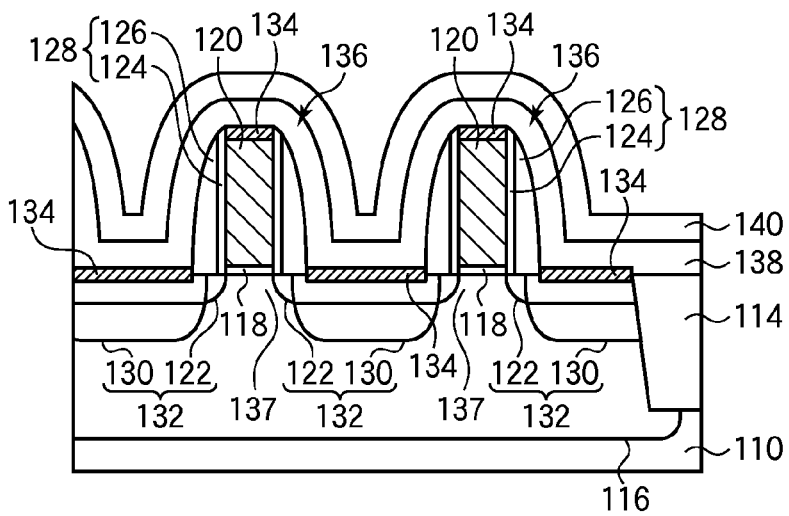

Then, on the entire surface, a silicon nitride film 140 is formed by CVD (see FIG. 39C).

Figure 40A:
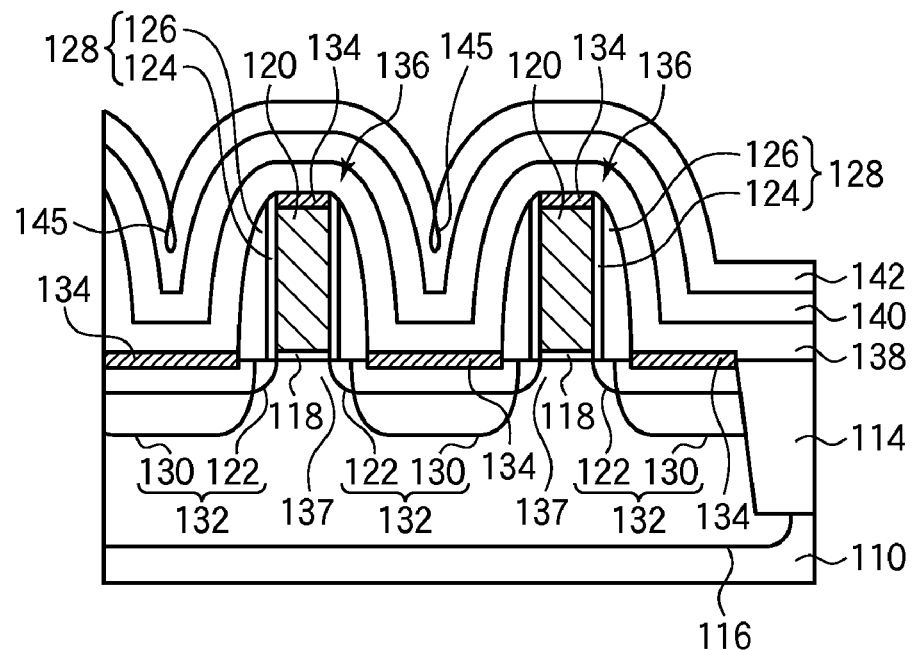

Next, on the entire surface, a silicon nitride film 142 is formed by CVD (see FIG. 40A).

Figure 40B:
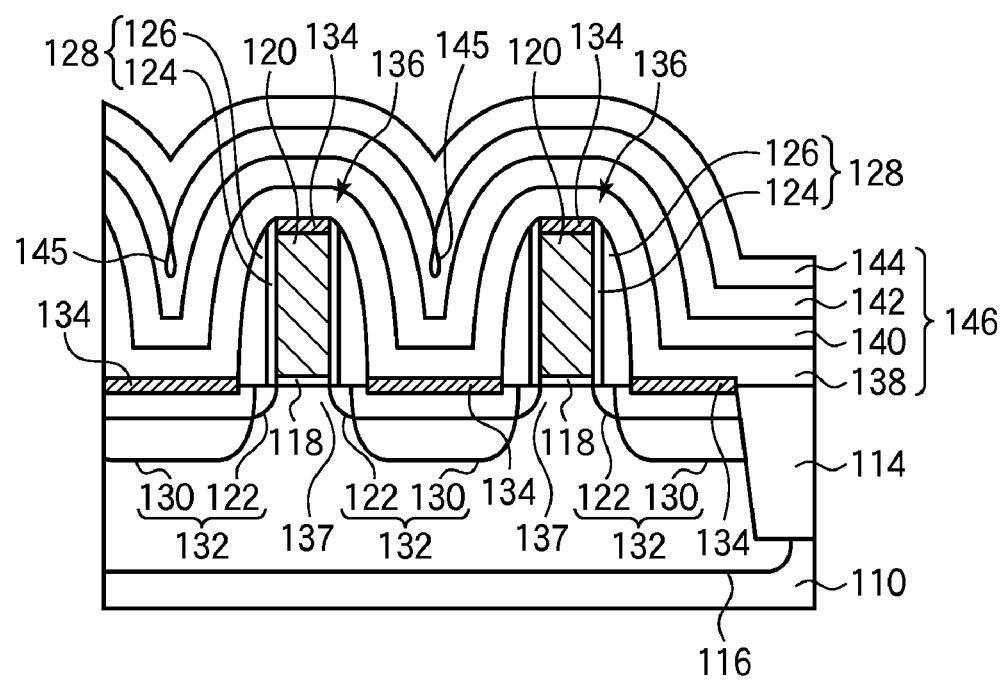

Next, on the entire surface, a silicon nitride film 144 is formed by CVD (see FIG. 40B). Thus, the stress film 146 is formed of the layer film of the silicon nitride film 138, 140, 142, 144.

Thus, the semiconductor device according to the reference is manufactured.

However, in the semiconductor manufacturing method according to the reference, voids (cavities, pores) 145 are often formed in the stress film 146 between the gate electrodes 120.

Voids 145 formed in the stress film 146 are a factor for causing short circuits, etc. in the contact plug forming step, which consequently lowers the reliability of the semiconductor device.

Preferred embodiments of the present invention will be explained with reference to accompanying drawings.

[a] First Embodiment

The semiconductor device manufacturing method according to a first embodiment will be described with reference to FIGS. 1A to 5B. FIGS. 1A to 4C are cross-sectional views of a semiconductor device in the steps of the semiconductor device manufacturing method according to the present embodiment, which illustrate the method.

Figure 1A:
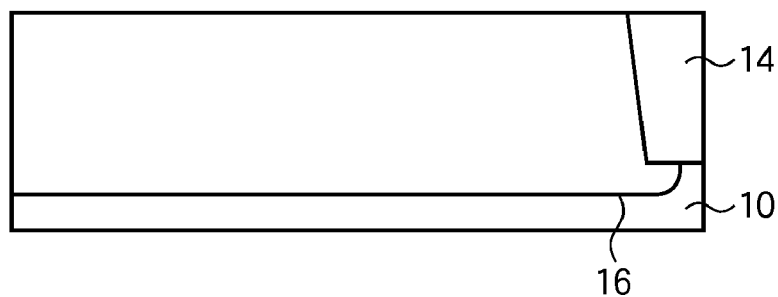
FIGS. 1A to 4C are cross-sectional views of a semiconductor device in the steps of the semiconductor device manufacturing method according to a first embodiment, which illustrate the method.
Figure 1B:
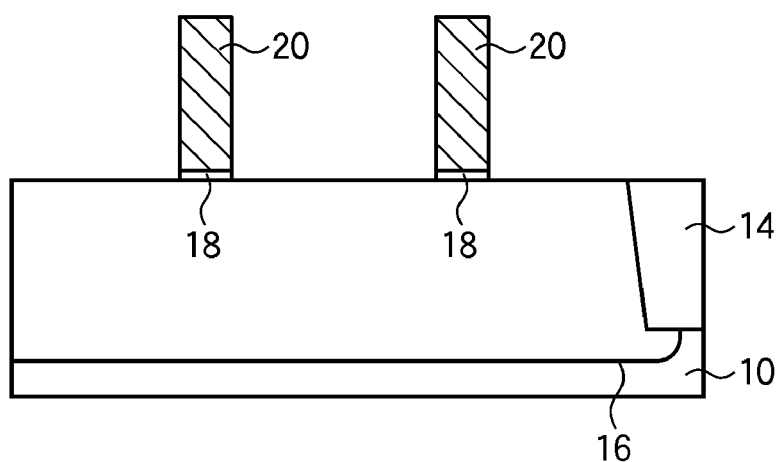
Figure 1C:
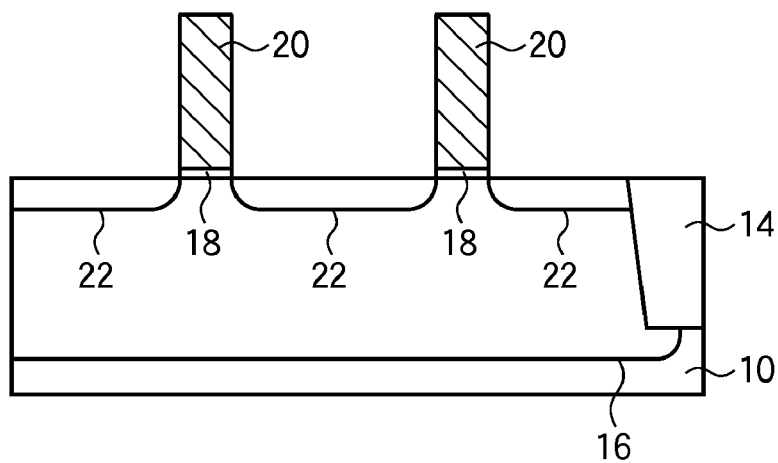

First, device isolation regions 14 for defining device regions are formed in a semiconductor substrate 10 by, e.g., STI (see FIG. 1A). The semiconductor substrate 10 is, e.g., a silicon substrate. As the material of the device isolation regions 14, silicon oxide film, for example, is used.

Then, a P-type dopant impurity is implanted in the semiconductor substrate 10 by, e.g., ion implantation to form P-type wells 16. As the P-type dopant impurity, B (boron), for example, is used. The acceleration voltage is, e.g., 100-200 keV. The dose is, e.g., $1 \times 10^{13}$-$5 \times 10^{13}$ cm$^{-2}$.

Then, on the entire surface, a gate insulation film 18 of, e.g., a 2-5 nm film thickness silicon oxide film is formed by, e.g., thermal oxidation.

Then, on the entire surface, a polysilicon film of, e.g., a 50-150 nm film thickness is formed by, e.g., CVD.

Next, the polysilicon film is patterned into the configuration of the gate electrodes 20 by photolithography. The line and space (L/S) of the gate electrodes 20 is as exemplified below. The line (L), i.e., the width of the gate lines 20, is, e.g., 20-90 nm. The space (S), i.e., the space between each of the gate electrodes 20 and its adjacent one 20 is, e.g., 50-200 nm. Thus, the gate electrodes 20 of the NMOS transistor 36 (see FIG. 2C) is formed (see FIG. 1B).

Next, with the gate electrodes 20 as the mask, an N-type dopant impurity is implanted into the semiconductor substrate 10 on both sides of the gate electrodes 20 by, e.g., ion implantation. As the N-type dopant impurity, As (arsenic), for example, is used. The acceleration voltage is, e.g., 5-10 keV. The dose is, e.g., $5 \times 10^{14}$-$10 \times 10^{14}$ cm$^{-2}$. Thus, the extension regions 22 forming the shallow regions of the extension source/drain structure are formed (see FIG. 1C).

Then, on the entire surface, a silicon nitride film 24 of, e.g., a 5-10 nm film thickness is formed by e.g., CVD.

Next, the silicon nitride film 24 is anisotropically etched by, e.g., RIE (Reactive Ion Etching).

Then, on the entire surface, a silicon nitride film 26 of, e.g., a 20-50 nm film thickness is formed by, e.g., CVD.

Next, the silicon nitride film 26 is anisotropically etched by, e.g., RIE. Thus, the sidewall insulation film 28 of the layer structure of the silicon nitride film 24 and the silicon nitride film 26 is formed on the side walls of the gate electrodes 20 (see FIG. 2A).

Then, with the gate electrodes 20 and the sidewall insulation film 28 are the mask, an N-type dopant impurity is implanted into the semiconductor substrate 10 on both sides of the gate electrodes 20 and the sidewall insulation film 28 by, e.g., ion implantation. As the N-type dopant impurity, P (phosphorus), for example, is used. The acceleration voltage is, e.g., 10-20 keV. The dose is, e.g., $3 \times 10^{13}$-$7 \times 10^{13}$ cm$^{-2}$. Thus, impurity diffused regions 30 forming the deep regions of the extension source/drain structure are formed. The extension regions 22 and the impurity diffused regions 30 form the source/drain diffused layers 32 of the extension source/drain structure (see FIG. 2B).

Next, on the entire surface, a metal film (not illustrated) of, e.g., a 10-30 nm film thickness is formed by, e.g., sputtering. As the metal film, nickel film or others, for example, is used. As the metal film, nickel alloy film with Pt or others added to may be formed.

Then, by, e.g., RTA (Rapid Thermal Annealing), thermal processing for siliciding the upper parts of the source/drain diffused layers 32 and the upper parts of the gate electrodes 20 is made. The thermal processing temperature is, e.g., 200-300° C. The thermal processing period of time is, e.g., 10-60 seconds.

Then, the parts of the metal film, which have not reacted are removed by wet etching. As the etchant, sulfuric acid-hydrogen peroxide mixture liquid, for example, is used.

Next, thermal processing is made by, e.g., RTA. The thermal processing temperature is, e.g., 300-400° C. The thermal processing period of time is, e.g., 10-120 seconds.

Thus, a silicide film 34 is formed on the source/drain diffused layers 32 and the gate electrodes 20. The silicide films 34 on the source/drain diffused layer 32 function as the source/drain electrodes.

Figure 2A:
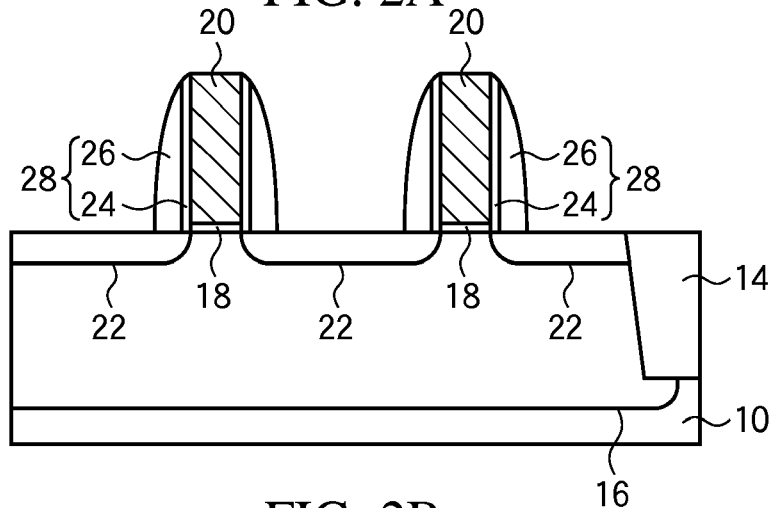
Figure 2B:
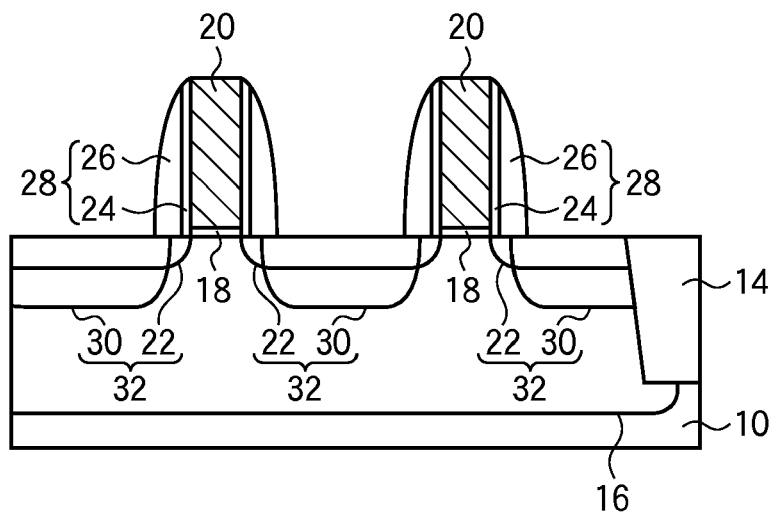
Figure 2C:
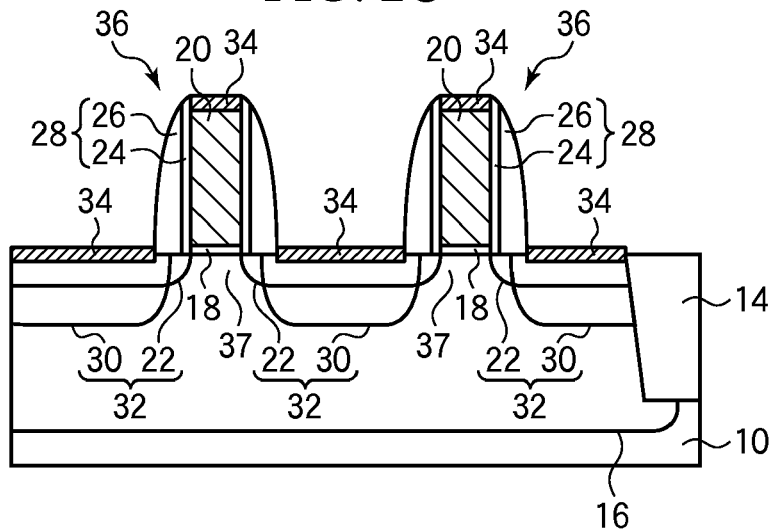

Thus, NMOS transistors 36 including the gate electrodes 20 and the source/drain diffused layers 32 are formed (see FIG. 2C).

Figure 3A:
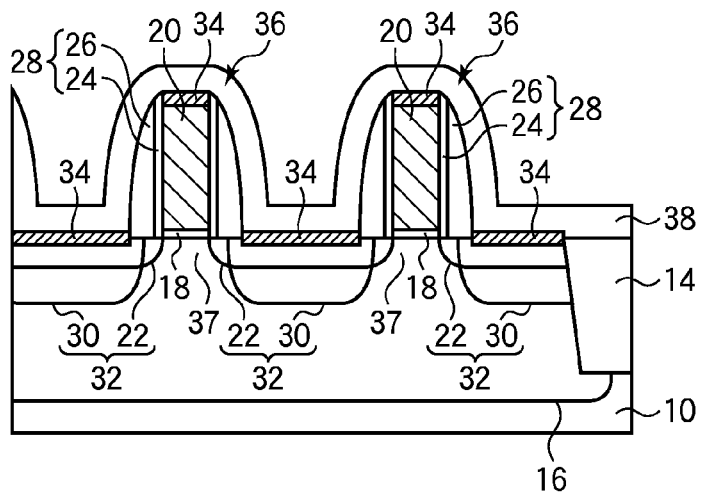

Then, on the entire surface, the first silicon nitride film 38 is formed by, e.g., CVD (see FIG. 3A). More specifically, the silicon nitride film 38 is formed by plasma-enhanced CVD. The silicon nitride film 38 functions as the tensile stress film which applies tensile stresses to the channel regions 37 of the transistors 36. The first silicon nitride film 38 applies tensile stresses together with the second silicon nitride film 40, the third silicon nitride film 42 and the fourth silicon nitride film 44 which are to be formed in later steps to the channel regions 37 of the transistors 36. The first silicon nitride film 38 is a part of the tensile stress film, i.e., a partial film, formed of the layer film of the silicon nitride films 38, 40, 42, 44. The film thickness of the silicon nitride film 38 is, e.g., about 10-90 nm. Into the film forming chamber, SiH$_4$ gas, NH$_3$ gas and N$_2$ gas, for example, are fed. The flow rate of the SiH$_4$ gas is, e.g., about 20-80 sccm. The flow rate of the NH$_3$ gas is, e.g., about 500-1300 sccm. The flow rate of the NH$_3$ gas is, e.g., about 900 sccm here. The flow rate of the N$_2$ gas is, e.g., about 600-1300 sccm. The pressure in the film forming chamber is, e.g., 2-14 Torr. The substrate temperature is, e.g., about 200-500° C. The frequency power to be applied is, e.g., about 50-200 W. The film forming period of time is, e.g., about 50-150 second.

Figure 3B:
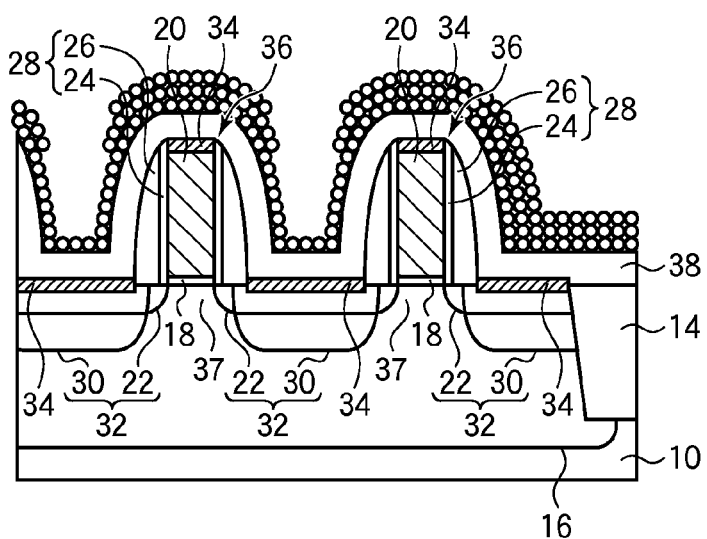

Then, $NH_4F$ (ammonium fluoride) radicals are applied to the silicon nitride film 38 through a shower head 52 (see FIG. 3B).

Figure 5A:
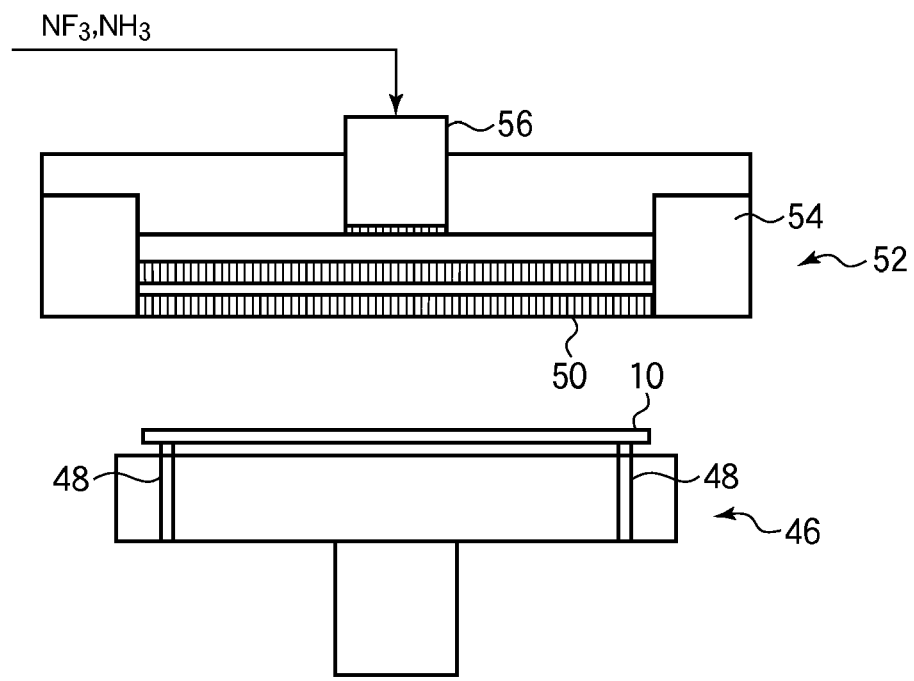
FIGS. 5A and 5B are views illustrating a part of an apparatus used in supplying $NH_4F$ radicals to a silicon nitride film.

FIG. 5 is views illustrating a part of a system used in supplying the $NH_4F$ radicals to the silicon nitride film. As the system, the reaction chambers of the dry cleaning system installed in semiconductor manufacturing lines (not illustrated), or others can be used.

In the reaction chamber in which the semiconductor substrate 10 is to be placed, a stage 46 for supporting the semiconductor wafer 10 is provided. In the stage 46, lift pins 48 for supporting the semiconductor wafer 10 are provided. The stage 46 can move up and down the semiconductor substrate 10.

Above the stage 46, a shower head 52 having a shower plate 50 is provided. In the shower head 52, a heater 54 for heating the shower plate 50 is provided. The shower head 52 can heat and jet gas.

In the upstream of the shower head 52, a plasma chamber (remote plasma chamber) 56 is provided. The plasma chamber 56 is remote from the semiconductor wafer 10. In the plasma chamber 56, gas fed into the plasma chamber 56 is made into plasma with high frequencies, and radicals are generated.

The high-frequency power to be applied in the plasma chamber 56 is, e.g., about 50 W. Into the plasma chamber 56, $NF_3$ (nitrogen trifluoride) gas, $NH_3$ (ammonium) gas and He gas, for example, are fed. The $NF_3$ gas and the $NH_3$ gas are the process gas, and the He gas is the diluent gas. The flow rate of the $NF_3$ gas is, e.g., about 5-30 sccm. The flow rate of the $NH_3$ gas is, e.g., about 50-100 sccm. The flow rate of the He gas is, e.g., about 200-400 sccm. The flow rate of the He gas is about 300 sccm. When the $NF_3$ gas and the $NH_3$ gas are fed into the plasma chamber 56, $NH_4F$ (ammonium fluoride) radicals, etc. are generated. The generated $NH_4F$ radicals, etc. are supplied to the silicon nitride film 38 on the semiconductor substrate 10 through the shower head 52 provided in the downstream of the plasma chamber 56. The $NH_4F$ radicals, etc. supplied to the silicon nitride film 38 function as an etchant of the silicon nitride film 38. The temperature of the shower plate 54 on the supply of $NH_4F$ radicals to the silicon nitride film 38 is, e.g., about 180° C.

The pressure in the reaction chamber for the semiconductor substrate 10 to be placed is, e.g., about 1-6 Torr. The high-frequency power to be applied to the semiconductor substrate 10 is, e.g., about 10-70 W.

When the etchant ($NH_4F$ radicals) are supplied to the silicon nitride film 38 with the temperature of the semiconductor substrate 10 set at a relatively high temperature, the etchant supplied to the silicon nitride film 38 sublimes, and the silicon nitride film 38 cannot be sufficiently etched. Accordingly, the temperature of the semiconductor substrate 10 in the supplying of the etchant to the silicon nitride film 38 is set preferably at a temperature which does not sublime the etchant. The temperature of the semiconductor substrate 10 is set substantially at, e.g., 20-40° C.

The temperature of the semiconductor substrate 10 in the supplying of the etchant to the silicon nitride film 38 is not limited to 35° C. The temperature of the semiconductor substrate 10 may be set substantially at a temperature which does not sublime the etchant. The temperature which does not sublime the etchant is, e.g. the room temperature to 100° C.

As illustrated in FIG. 3B, the interval between each of the gate electrodes 20 and its adjacent one 20 is relatively small. Accordingly, the $NH_4F$ radicals, which are the etchant, are not easily supplied to the parts of the silicon nitride film 38, which are positioned between the gate electrodes 20.

On the other hand, the $NH_4F$ radicals to be the etchant are easily supplied to the parts of the silicon nitride film 38 other than the parts thereof positioned between the gate electrodes 20.

As illustrated in FIG. 3B, the distribution of a dose of the etchant supplied to the silicon nitride film 38 is shown schematically by circles.

As illustrated in FIG. 3B, a relatively large quantity of the echant is supplied to the parts of the silicon nitride film 38 other than the parts thereof positioned between the gate electrodes 20.

On the other hand, a relatively small quantity of the etchant is supplied to the parts of the silicon nitride film 38 positioned between the gate electrodes 20.

When the $NH_4F$ radicals are supplied to the silicon nitride film 38, the $NH_4F$ radicals and the SiN react with each other, and it is considered that fluoride is produced. It is considered that the fluoride is $(NH_4)_2SiNF_6$, etc.

A relatively large quantity of the etchant is supplied to the parts of the silicon nitride film 38 other than the parts thereof positioned between the gate electrodes 20, and an etched quantity of the silicon nitride film 38 there is relatively large.

On the other hand, a quantity of the etchant is relatively small at the parts of the silicon nitride film 38 positioned between the gate electrodes 20 is relatively small, and an etched quantity of the silicon nitride film 38 there is relatively small.

The period of time during which the etchant is being supplied to the silicon nitride film 38, i.e., the etching period of time is set at, e.g., about 20-60 seconds.

Figure 5B:
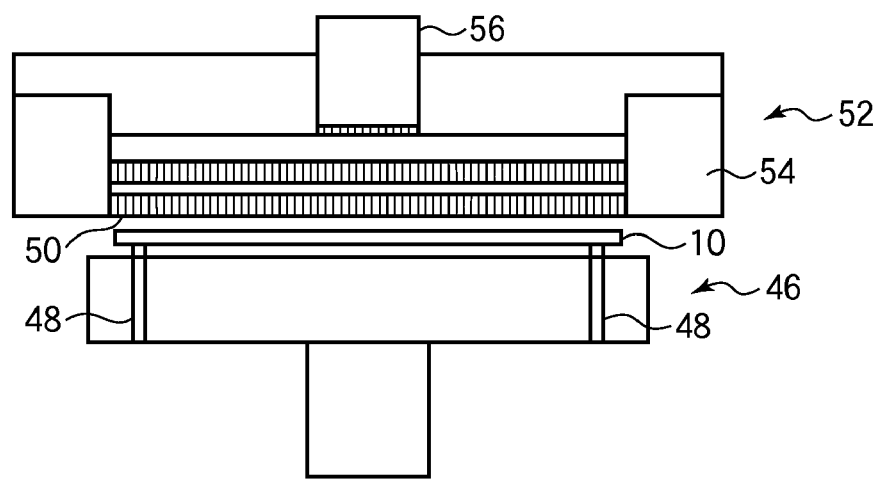

Then, thermal processing (annealing) is made on the silicon nitride film 38. Specifically, as illustrated in FIG. 5B, the stage 46 supporting the semiconductor substrate 10 is lifted to thereby bring the semiconductor substrate 10 and the shower head 52 near to each other. The temperature of the shower plate 54 at the time the shower head 52 and the semiconductor substrate 10 are brought near to each other is, e.g., about 180° C. At this time, $H_2$ gas is ejected to the silicon nitride film 38 through the shower head 52. The silicon nitride film 38 is brought near to the heated shower head 52, and besides, the $H_2$ gas heated by the shower head 52 is supplied to the silicon nitride film 38, whereby the silicon nitride film 38 is quickly heated. When the silicon nitride film 38 is heated to, e.g., 100° C. or above, the fluoride, etc. produced by reacting the etchant and the SiN with each other sublime into $SiF_4$ gas, $NH_3$ gas, etc. The part of the silicon nitride film 38 which has become fluoride, etc. by the reaction of the SiN with the etchant is sublimed by this thermal processing and removed, and the silicon nitride film 38 is etched back. Thus, the silicon nitride film 38 is etched by, e.g., about 5-40 nm on the gate electrodes 20.

In the parts of the silicon nitride film 38 other than the parts positioned between the gate electrodes 20, where a relatively large quantity of the fluoride, etc. is produced, the surface of the silicon nitride film 38 is relatively largely removed.

On the other hand, in the parts of the silicon nitride film 38 positioned between the gate electrodes 20, where a relatively small quantity of the fluoride, etc. is produced, the removed quantity of the surface of the silicon nitride film 38 is relatively small.

Figure 3C:
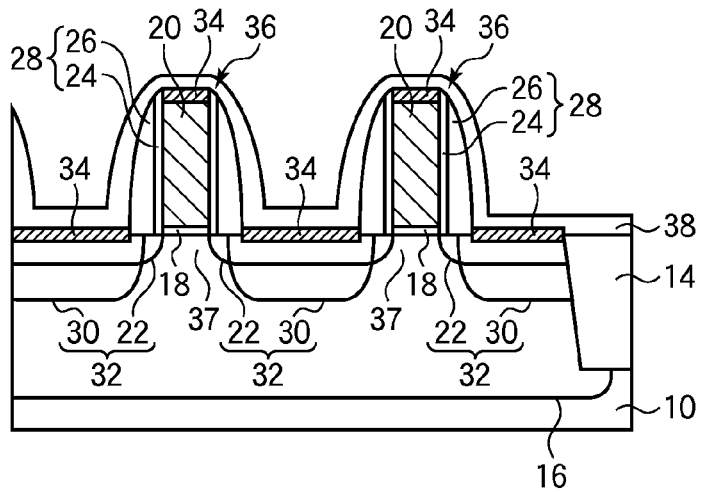

Accordingly, in the parts of the silicon nitride film 38 other than the parts positioned between the gate electrodes 20, as illustrated in FIG. 3C, the film thickness of the residual silicon nitride film 38 is relatively small.

On the other hand, in the parts of the silicon nitride film 38 positioned between the gate electrodes 20, as illustrated in FIG. 3C, the silicon nitride film 38 resides relatively thick.

In the parts where the gate electrodes 20 are adjacent to each other, the silicon nitride film 38 resides with the film thickness of the silicon nitride film 38 gradually decreased from the tops of the source/drain diffused layers 32 toward the tops of the gate electrodes 20.

Accordingly, in the parts where the gate electrodes 20 are adjacent to each other, the inclination of the surface of the silicon nitride film 38 is relatively blunt. This contributes to preventing the generation of voids (cavities, pores) between the gate electrodes 20 adjacent to each other when the silicon nitride films 40, 42. 44 are formed in later steps.

The silicon nitride film 38 is thus etched back. The film thickness of the etched back silicon nitride film 38 on the gate electrodes 20 is, e.g., about 10-40 nm.

When the film thickness of the parts of the silicon nitride film 38 on the gate electrodes 20 is excessively small, sufficient stresses cannot be applied to the channel regions 37 of the NMOS transistors 36. Accordingly, it is preferable not to make the film thickness of the parts of the silicon nitride film 38 on the gate electrodes 20 excessively small. Specifically, the film thickness of the etched-back silicon nitride film 38 on the gate electrodes 20 is preferably, e.g., more than 5-15 nm.

Then, UV cure is made on the silicon nitride film 38. When the UV cure is made, the atmosphere inside the chamber is, e.g., helium atmosphere. The flow rate of the helium gas is, e.g., about 7000-12000 sccm. The pressure inside the chamber is, e.g., about 2.0-14 Torr. The power of the UV lamp is about 20-180 W. The power of the UV lamp is about 100 W here. The temperature of the semiconductor substrate 10 is, e.g., about 300-500° C. The period of time of the UV cure is, e.g., about 1-20 minutes. The period of time of the UV cure is about 5 minutes here. The film thickness of the silicon nitride film 38 on the gate electrodes 20 after the UV cure becomes, e.g., about 10-40 nm.

Figure 4A:
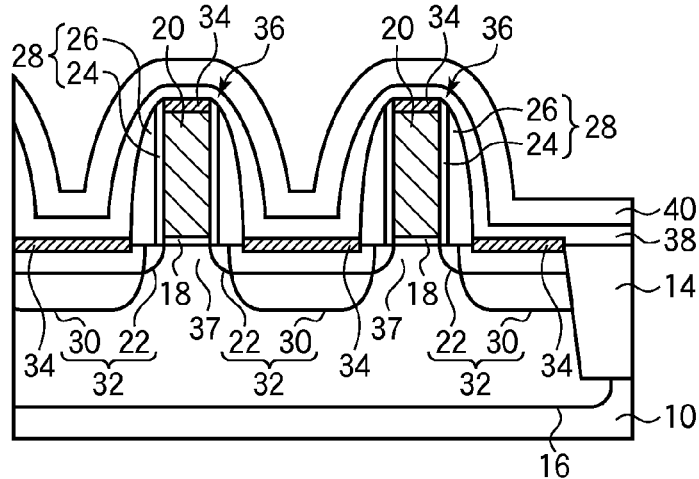

Next, in the same way as the process for forming the silicon nitride film 38 described above with reference to FIG. 3A, the second silicon nitride film 40 is formed (see FIG. 4A). The film thickness of the silicon nitride film 40 is, e.g., 30-60 nm. No voids are formed in the silicon nitride film 40 because the silicon nitride film 40 is formed on the etched-back silicon nitride film 38.

Then, in the same way as the above-described UV cure made on the silicon nitride film 38, UV cure is made on the silicon nitride film 40. The film thickness of the UV-cured silicon nitride film 40 on the gate electrodes 20 is, e.g., about 10-50 nm.

Figure 4B:
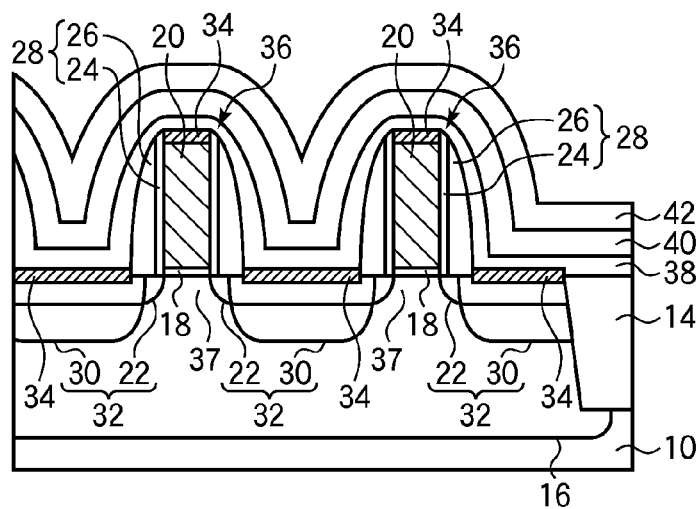

Next, in the same way as the process for forming the silicon nitride film 38 described above with reference to FIG. 3A, the third silicon nitride film 42 is formed (see FIG. 4B). The film thickness of the silicon nitride film 42 is, e.g., 30-60 nm. No voids are made in the silicon nitride film 42 because the silicon nitride films 40, 42 are stacked on the silicon nitride film 38 etched back as described above.

Next, in the same way as the above-described UV cure made on the silicon nitride film 38, UV cure is made on the silicon nitride film 42. The film thickness of the UV cured silicon nitride film 42 on the gate electrodes 20 becomes, e.g., about 10-50 nm.

Figure 4C:
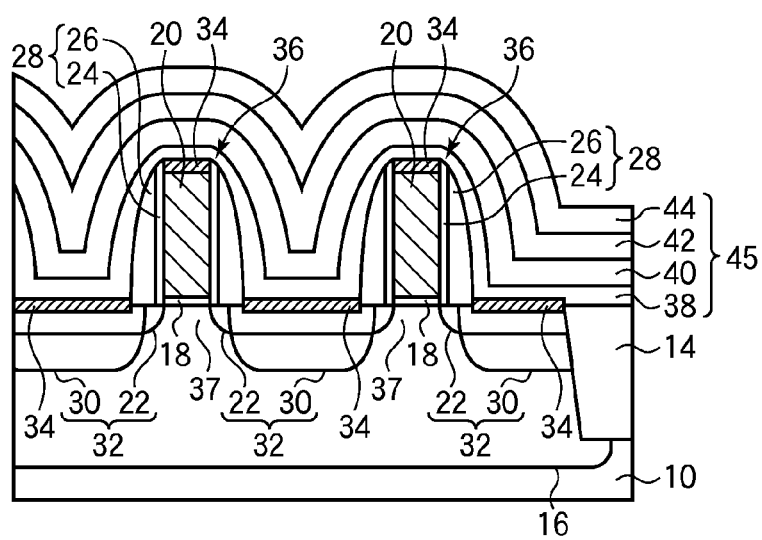

Next, in the same way as the process for forming the silicon nitride film 38 described above with reference to FIG. 3A, the fourth silicon nitride film 44 is formed (see FIG. 4C). The film thickness of the silicon nitride film 44 is, e.g., 30-60 nm. No voids are formed in the silicon nitride film 44 because the silicon nitride films 40, 42, 44 are stacked on the etched-back silicon nitride film 38 as described above.

Then, in the same way as the above-described process for forming the silicon nitride film 38, UV cure is made on the silicon nitride film 44. The film thickness of the UV cured silicon nitride film 44 on the gate electrodes 20 becomes, e.g., about 10-50 nm. The total film thickness of the silicon nitride films 38, 40, 42, 44 becomes, e.g., about 50-100 nm.

Thus, the tensile stress film 45 formed of the layer film of the silicon nitride films 38, 40 42, 44 is formed, covering the NMOS transistors 36.

Thus, the semiconductor device of the present embodiment is manufactured.

[Evaluation Result]

Next, the result of evaluating the semiconductor device manufacturing method according to the present embodiment will be described with reference to FIGS. 6 to 9.

Figure 6:
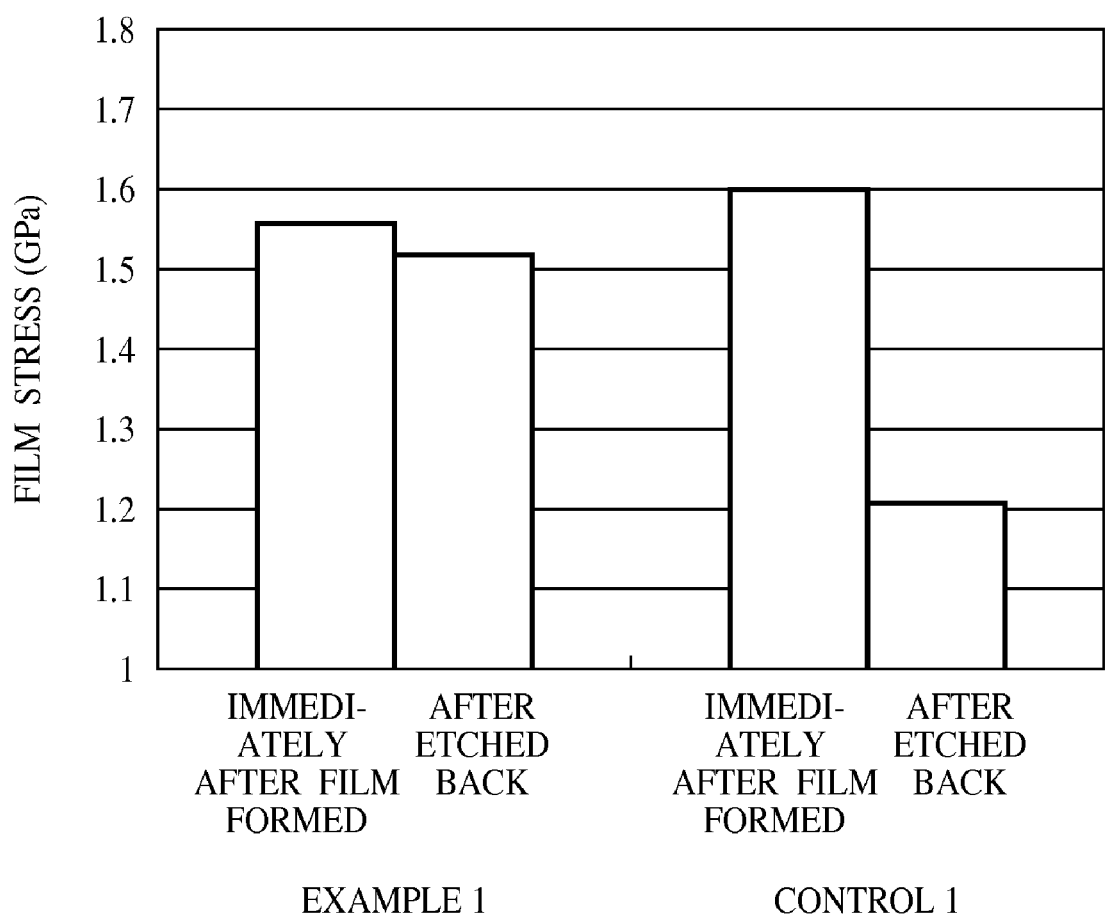
FIG. 6 is a graph of a film stress of the silicon nitride film.

FIG. 6 is the graph of the film stress of silicon nitride film. In FIG. 6, Example 1 is the present embodiment, wherein $NH_4F$ radicals are supplied to the silicon nitride film 38, and then thermal processing is made on the silicon nitride film 38 to thereby etch back the silicon nitride film 38. In FIG. 6, Control 1 is the case wherein HDP plasma (High Density Plasma) of Ar (argon) is applied to the silicon nitride film to thereby etch back the silicon nitride film. In FIG. 6, "Immediately after the film formed" indicates the film stress of the silicon nitride film immediately after the silicon nitride film has been formed. The film thickness of the silicon nitride film immediately after the firm formation was 40 nm. In FIG. 6, "after etched back" indicates the film stress of the silicon nitride film after etched back. The film thickness of the silicon nitride film on the gate electrodes after etched back was 30 nm.

As seen in FIG. 6, in Control 1, the film stress of the silicon nitride film lowers as much as about 25%.

In contrast to this, in Example 1, the decrease of the film stress of the silicon nitride film is as little as about 4%.

Based on this, it is seen that according to the present embodiment can etch back the silicon nitride film without much lowering the film stress of the silicon nitride film. According to the present embodiment, transistors of high mobility and good electric characteristics can be formed so that required stresses can be applied to the channels regions of the transistors.

Figure 7:
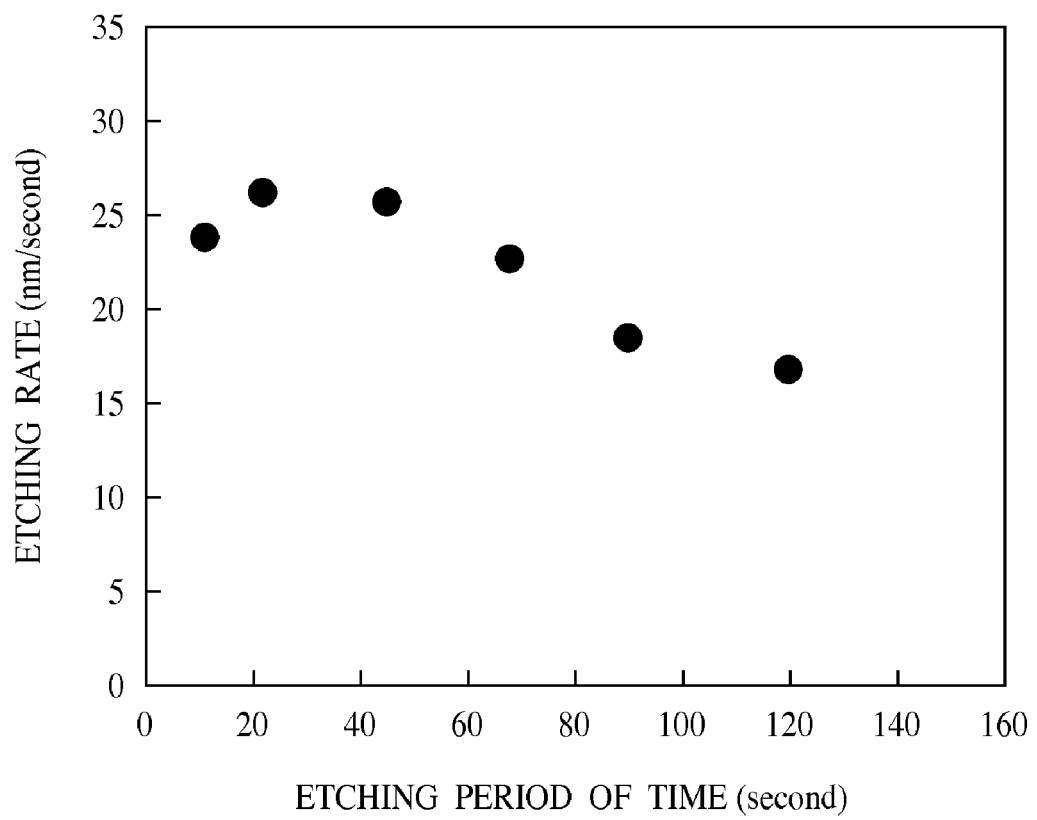
FIG. 7 is a graph of a relationship between an etching period of time of the silicon nitride film having tensile stress and an etching rate thereof.

FIG. 7 is the graph of the relationships between the etching period of time and the etching rate. In FIG. 7, on the horizontal axis, the etching period of time, i.e., the period of time of supplying $NH_4F$ radicals to the silicon nitride film is taken. In FIG. 7, on the vertical axis, the etching rate of the silicon nitride film is taken.

As seen in FIG. 7, as the etching period of time is longer, the etching rate of the silicon nitride film lowers.

Figure 8:
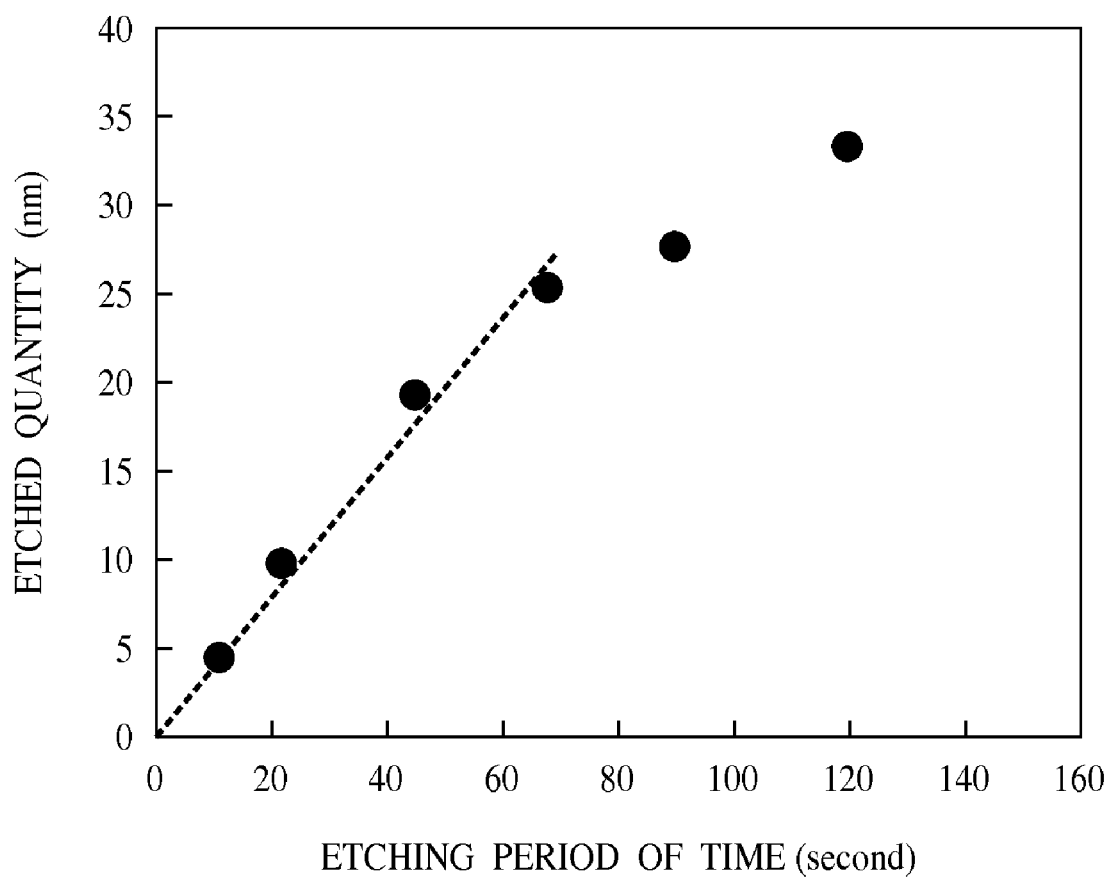
FIG. 8 is a graph of a relationship between the etching period of time of silicon nitride film having tensile stress and an etched quantity thereof.

FIG. 8 is the graph of the relationships between the etching period of time and the etched quantity. In FIG. 8, on the horizontal axis, the etching period of time, i.e., the period of time of supplying $NH_4F$ radicals to the silicon nitride film is taken. In FIG. 8, on the vertical axis, the etching quantity of the silicon nitride film is taken.

As seen in FIG. 8, the etching quantity of the silicon nitride film depends on the etching period of time, but as the etching period of time is longer, the etching rate tends to lower.

Figure 9:
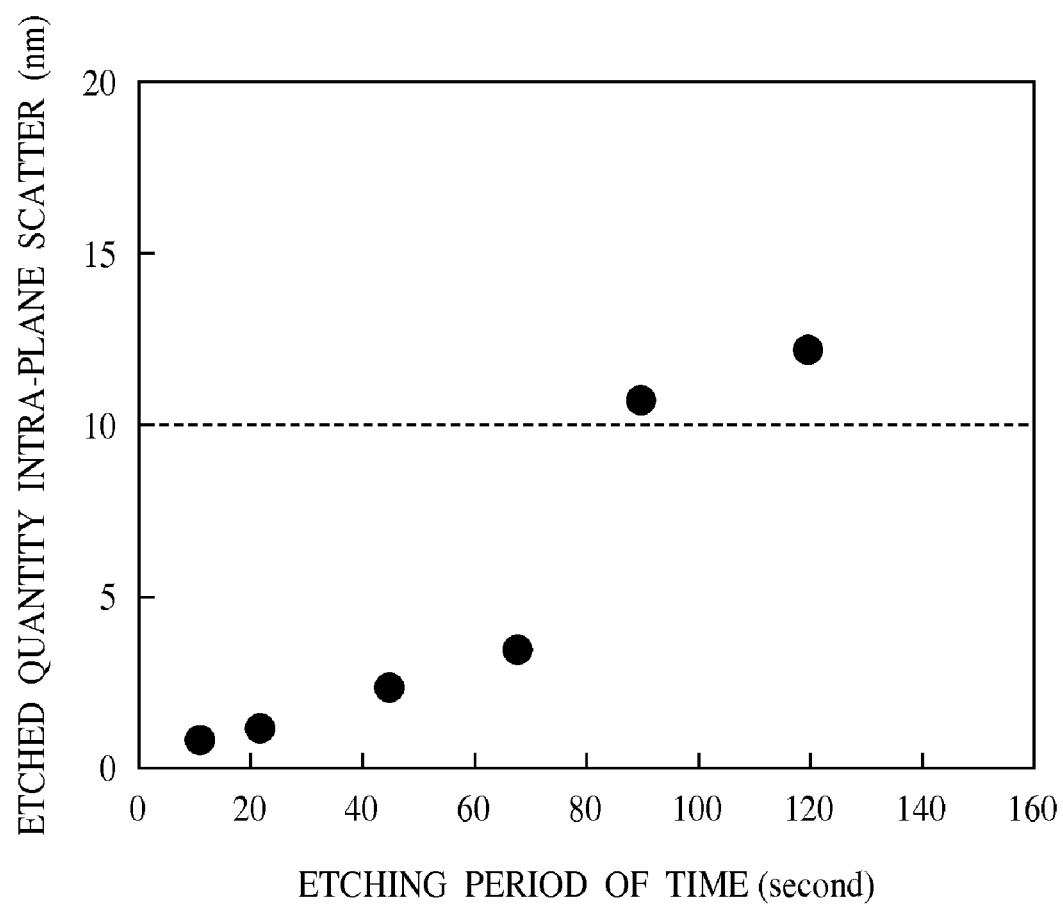
FIG. 9 is a graph of a relationship between the etching period of time of silicon nitride film having tensile stress and an intra-plane etched quantity scatter thereof.

FIG. 9 is the graph of relationships between the etching period of time and the intra-plane scatter of the etched quantity. In FIG. 9, on the horizontal axis, the etching period of time, i.e., the period of time of supplying $NH_4F$ radicals to the silicon nitride film is taken. In FIG. 9, on the vertical axis, the intra-plane scatter of the etched quantity, more specifically, the difference between the maximum value and the minimum value of the etched quantity is taken.

As shown in FIG. 9, as the etching period of time is longer, the intra-plane scatter of the etched quantity tends to increase.

The intra-pane scatter of the etched quantity is preferably 10 nm or below. Accordingly, the etching period of time is preferably 90 seconds or below.

As described above, according to the present embodiment, $NH_4F$ radials as the etchant are supplied to the silicon nitride film 38, and then thermal processing is made on the silicon nitride film 38, whereby the silicon nitride film 38 is etched back. To the parts of the silicon nitride film 38 positioned between the gate electrodes 20, a relatively small quantity of the etchant is supplied, and the etched quantity of the silicon nitride film 38 becomes relatively small. On the other hand, the parts of the silicon nitride film 38 other than the parts positioned between the gate electrodes 20, a relatively large quantity of the etchant is supplied, the silicon nitride film 38 is etched relatively large. Accordingly, according to the present embodiment, the silicon nitride film 38 resides with the film thickness of the silicon nitride film 38 decreased gradually from the tops of the source/drain diffused layers 32 toward the tops of the gate electrodes 20. Accordingly, according to the present embodiment, the inclination of the surface of the silicon nitride film 38 becomes relatively blunt at the parts where the gate electrodes 20 are adjacent to each other. Since the silicon nitride films 40, 42, 44 are formed on such etched-back silicon nitride film 38, according to the present embodiment, the generation of voids in the layer film 45 of the silicon nitride films 38, 40, 42, 44 can be prevented. Accordingly, according to the present embodiment, the semiconductor device of high reliability can be provided with high yield.

Modifications

Next, the semiconductor device manufacturing method according to a modification of the present embodiment will be described with reference to FIGS. 10A to 12B. FIGS. 10A to 12B are cross-sectional views of a semiconductor device in the steps of the semiconductor device manufacturing method, which illustrate the method.

The semiconductor device manufacturing method according to the present modification is characterized mainly in that the silicon nitride film 38 is etched back separately twice.

Figure 10A:
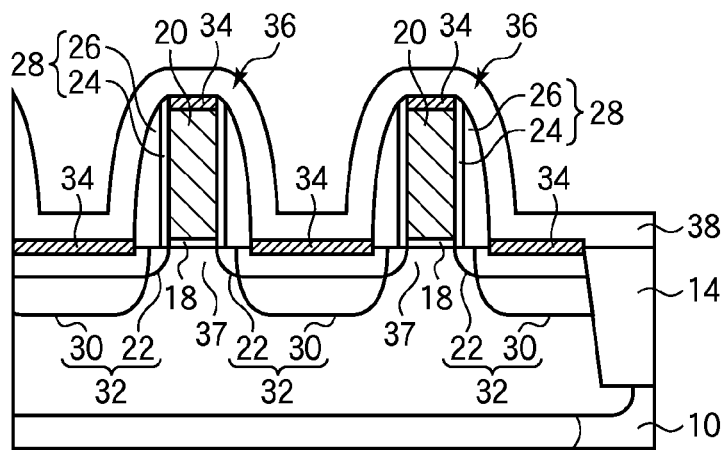
FIGS. 10A to 12B are cross-sectional views of a semiconductor device in the steps of the semiconductor device manufacturing method according to a modification of the first embodiment, which illustrate the method.

First, the step of forming the device isolation regions 14 to the step of forming the silicon nitride film 38 are the same as those of the semiconductor device manufacturing method according to the first embodiment illustrated in FIGS. 1A to 3A, and their description will not be repeated (see FIG. 10A).

Figure 10B:
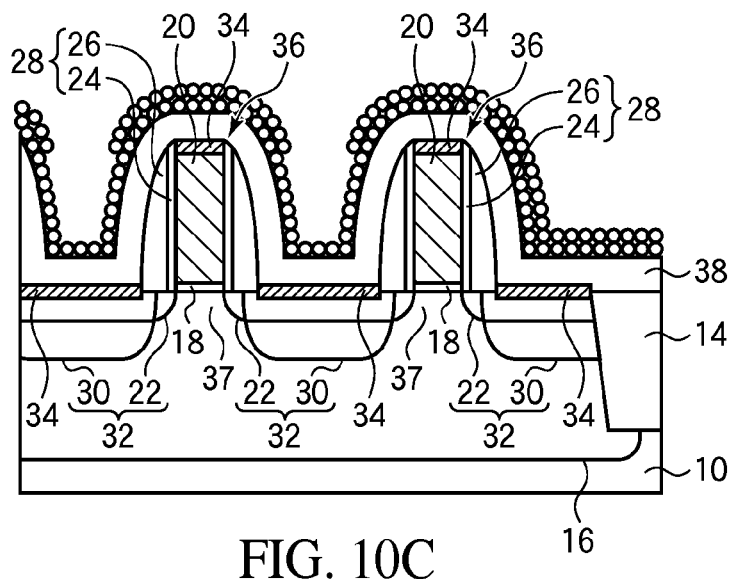

Next, in the same way as in the semiconductor device manufacturing method according to the first embodiment described above with reference to FIG. 3B, $NH_4F$ radicals as the etchant are supplied to the silicon nitride film 38 (see FIG. 10B). In the present embodiment, the silicon nitride film 38 is etched back separately twice, and the first etching period of time may be around a half of the etching period of time of the first embodiment. The etching period of time for the first etching is, e.g., 10-30 seconds here. The etching conditions other than the etching period of time are the same as the etching conditions are the same as the etching conditions for the silicon nitride film 38 described above with reference to FIG. 3B.

Figure 10C:
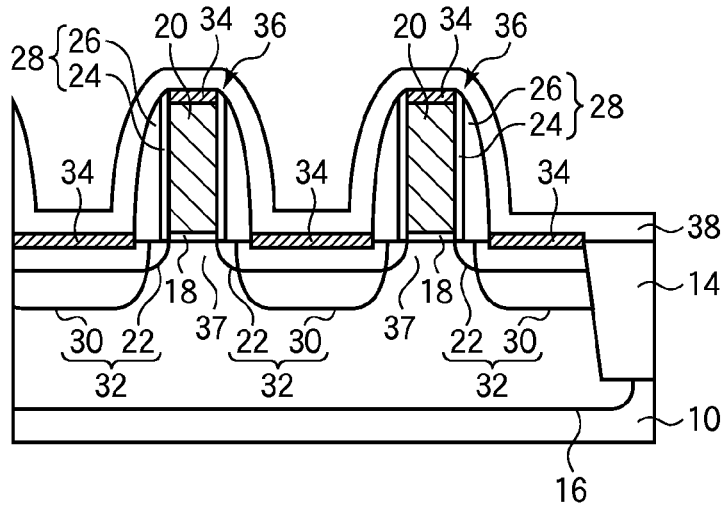

Then, in the same way as in the semiconductor device manufacturing method according to the first embodiment described above with reference to FIG. 3C, the thermal processing is made on the silicon nitride film 38 (see FIG. 10C). In the parts of the silicon nitride film 38 positioned between the gate electrodes 20, the etchant is supplied in a relatively small quantity, and the etched quantity of the silicon nitride film 38 is relatively small. On the other hand, in the parts of the silicon nitride film 38 other than the parts positioned between the gate electrodes 20, the etchant is supplied in a relatively large quantity, and the silicon nitride film 38 is etched relatively large. Accordingly, the silicon nitride film 38 resides with the film thickness of the silicon nitride film 38 decreased gradually from the tops of the source/drain diffused layers 32 toward the tops of the gate electrodes 20. Accordingly, the inclination of the surface of the silicon nitride film 38 becomes relatively blunt at the parts where the gate electrodes 20 are adjacent to each other.

Thus, the first etching-back is made on the silicon nitride film 38. By such etching back, the silicon nitride film 38 is etched back by, e.g., about 5-35 nm at the parts on the gate electrodes 20. The film thickness of the silicon nitride film 38 after the first etching-back on the gate electrodes 20 is, e.g., about 10 40 nm.

Figure 11A:
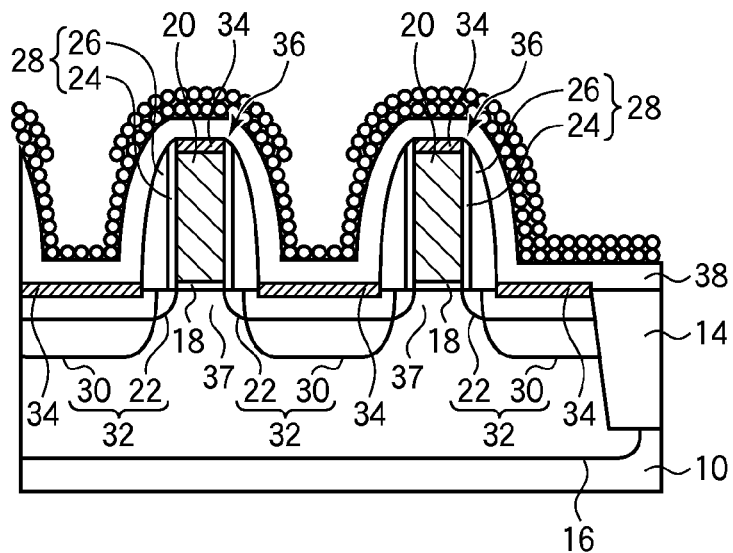

Then, in the same way as in the semiconductor manufacturing method according to the first embodiment described above with reference to FIG. 3B, $NH_4F$ radicals as the etchant are supplied to the silicon nitride film 38 (see FIG. 11A). In the present modification, in which, as described above, the silicon nitride film 38 are etched back separately twice, the etching period of time for once etching-back may be about a half of the etching period of time of the first embodiment. The etching period of time for the second etching-back is, e.g., 10-30 seconds here. The etching conditions other than the etching period of time are the same as the etching conditions for etching the silicon nitride film 38 described above with reference to FIG. 3B.

Figure 11B:
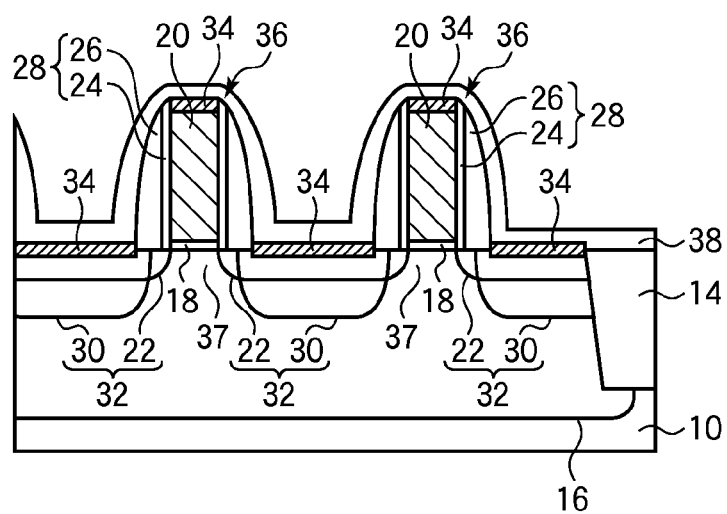
Figure 11C:
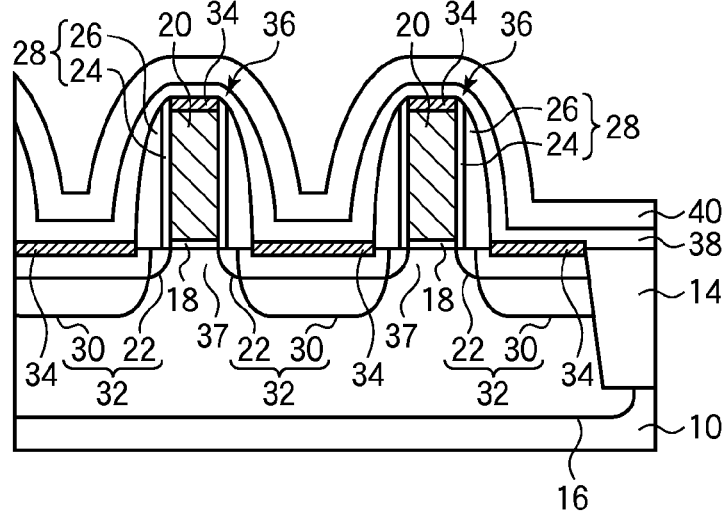
Figure 12A:
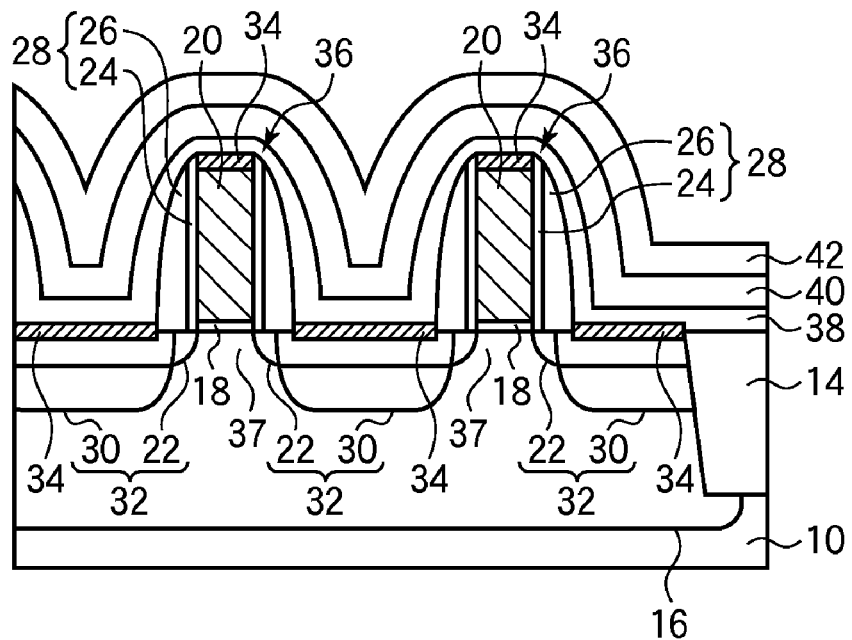
Figure 12B:
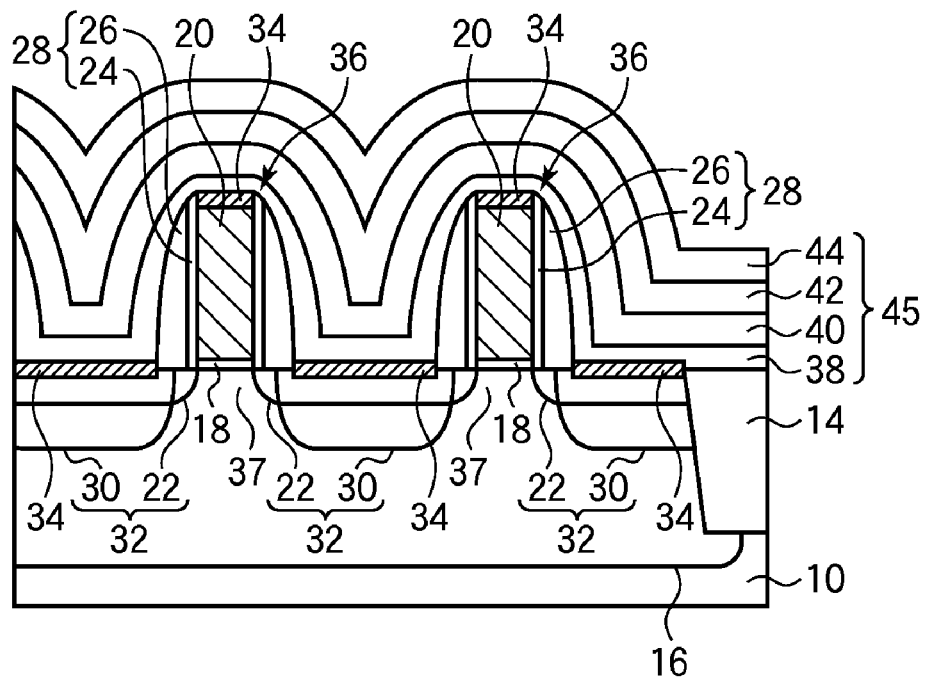
Figure 13A:
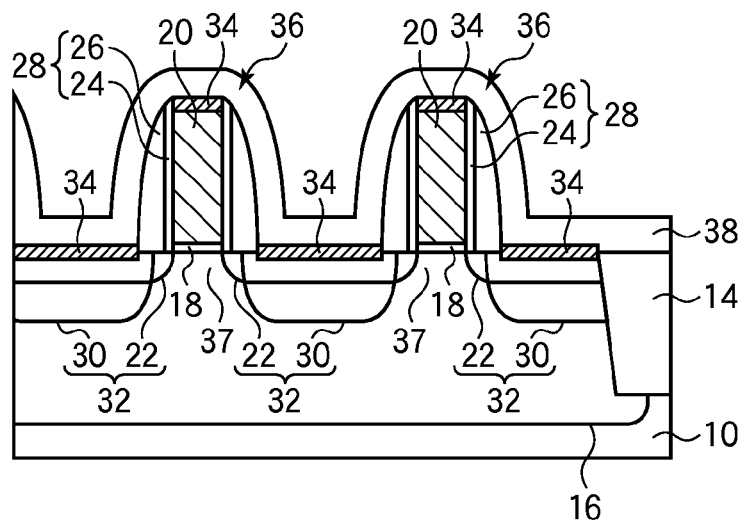
FIGS. 13A to 15B are cross-sectional views of a semiconductor device in the steps of the semiconductor device manufacturing method according to a second embodiment, which illustrate the method.
Figure 13B:
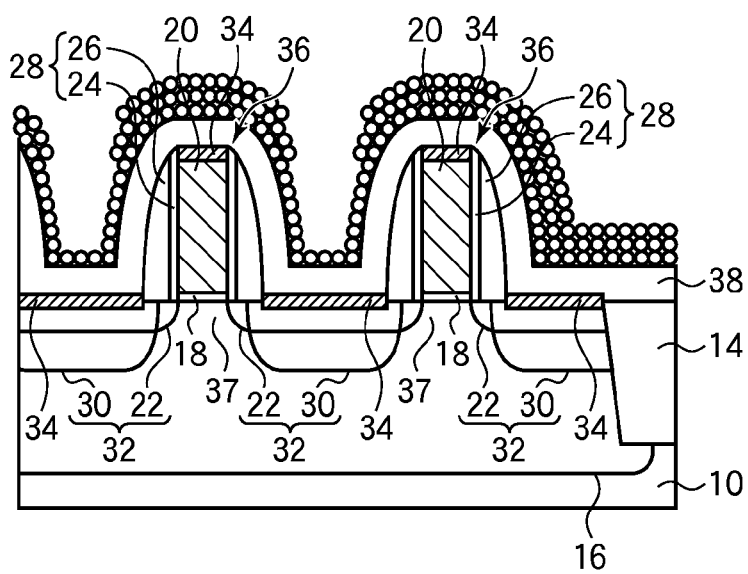
Figure 13C:
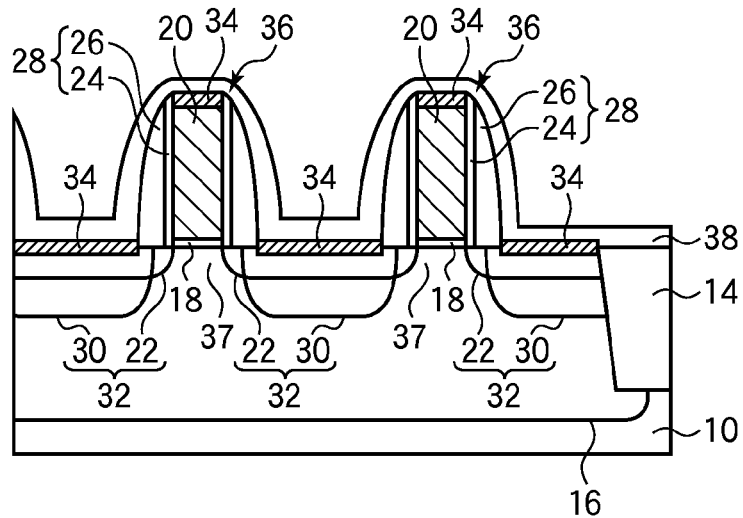

Next, in the same way as in the semiconductor device manufacturing method according to the first embodiment described above with reference to FIG. 3C, thermal processing is made on the silicon nitride film 38 (see FIG. 11B). At the parts of the silicon nitride film positioned between the gate electrodes 20, a relatively small quantity of the etchant is supplied, and the etched quantity of the silicon nitride film 38 is relatively small. On the other hand, at the parts of the silicon nitride film 38 other than the parts positioned between the gate electrodes 20, a relatively large quantity of the etchant is supplied, and the silicon nitride film 38 is etched relatively large. Accordingly, the silicon nitride film 38 resides with the film thickness of the silicon nitride film 38 decreasing gradually from the tops of the source/drain diffused layers 32 positioned between the gate electrodes 20 toward the tops of the gate electrodes 20. Accordingly, the inclination of the surface of the silicon nitride film 38 becomes relatively blunt at the parts where the gate electrodes 20 are adjacent to each other. This contributes to preventing the generation of voids between the adjacent gate electrodes 20 when the silicon nitride films 40, 42, 44 are formed in later steps.

Thus, the second etching-back is made on the silicon nitride film 38. By such etching-back, the silicon nitride film 38 is etched back by, e.g., about 5-35 n m at the parts on the gate electrodes 20. The film thickness of the silicon nitride film 38 after etched back on the gate electrodes 20 is set at, e.g., about 10-40 nm.

Then, in the same way as in the semiconductor device manufacturing method described above with reference to FIG. 3C, UV cure is made on the silicon nitride film 38. The film thickness of the silicon nitride film 38 after UV-cured on the gate electrodes 20 is set at, e.g., about 10-40 nm.

Thus, the etching-back on the silicon nitride film 38 is made separately twice.

The semiconductor manufacturing method hereafter is the same of that of the semiconductor manufacturing method according to the first embodiment described above with reference to FIGS. 4A to 4C is the same, and its description will not be repeated (see FIG. 11C to FIG. 12B).

As described above, the etching-back on the silicon nitride film 38 may be made separately twice.

[b] A Second Embodiment

The semiconductor device manufacturing method according to a second embodiment will be described with reference to FIGS. 13A to 15B. FIGS. 13A to 15B are cross-sectional views of a semiconductor device in the steps of the semiconductor device manufacturing method according to the present embodiment, which illustrate the method. The same members of the present embodiment as those of the semiconductor manufacturing method according to the first embodiment illustrated in FIGS. 1A to 12B are represented by the same reference numbers not to repeat or to simplify the description.

The semiconductor device manufacturing method according to the present embodiment is characterized mainly in that not only the first silicon nitride film 38 but also the second silicon nitride film 40 is etched back with $NH_4F$ radicals.

First, the steps of forming the device isolation regions 14 in the semiconductor substrate 10 to the step of forming the silicon nitride film 40 are the same as those of the semiconductor device manufacturing method according to the first embodiment described above with reference to FIGS. 1A to FIGS. 4A, and their description will not be repeated (see FIGS. 13A to 14A).

Figure 14A:
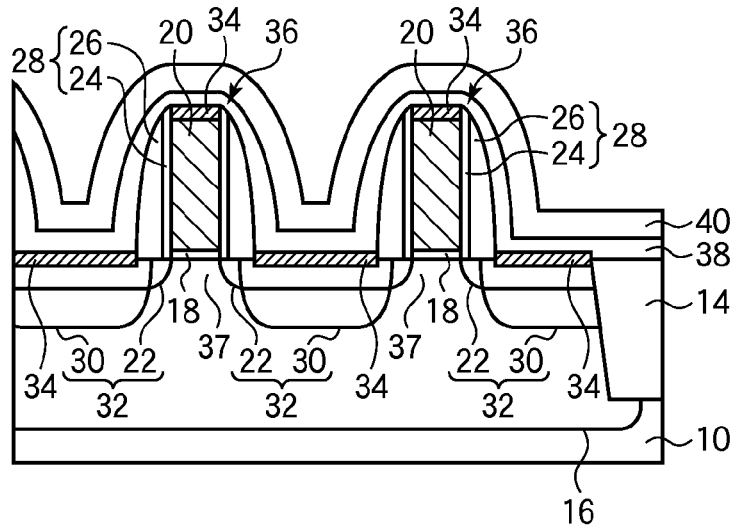
Figure 14B:
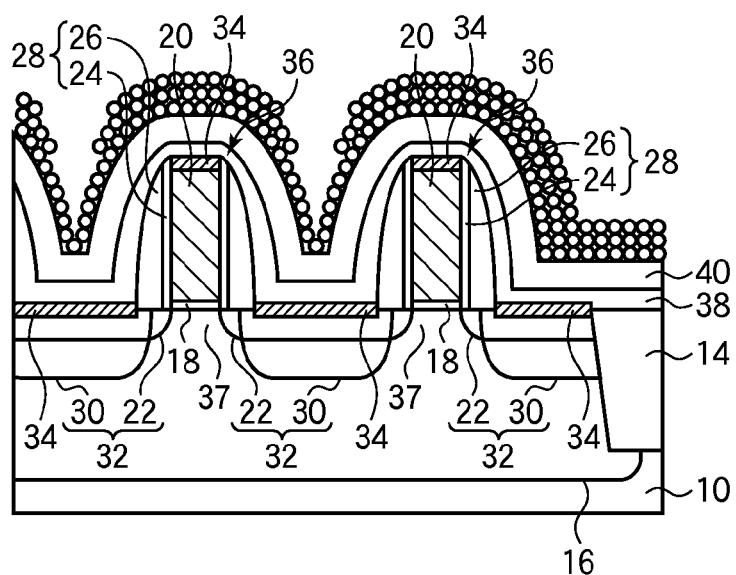

Next, in the same way as in the semiconductor device manufacturing method according to the first embodiment described above with reference to FIG. 3B, $NH_4F$ radicals as the etchant are supplied to the silicon nitride film 40 (see FIG. 14B).

Figure 14C:
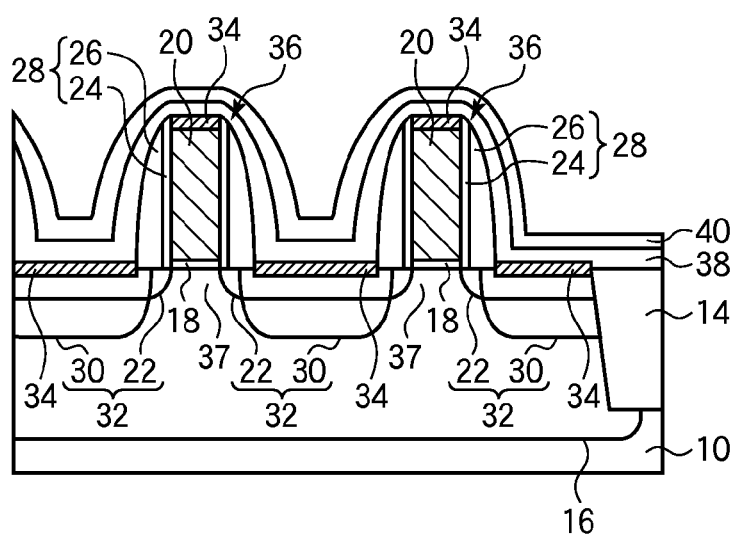

Then, in the same way as in the semiconductor device manufacturing method according to the first embodiment described above with reference to FIG. 3C, thermal processing is made on the silicon nitride film 40 to thereby etch back the silicon nitride film 40 (see FIG. 14C). At the parts of the silicon nitride film 40 positioned between the gate electrodes 20, a relatively small quantity of the etchant is supplied, and an etched quantity of the silicon nitride film 40 is relatively small. On the other hand, at the parts of the silicon nitride film 40 other than the parts positioned between the gate electrodes 20, a relatively large quantity of the etchant is supplied, the silicon nitride film 40 is etched relatively large. Accordingly, the silicon nitride film 40 resides with the film thickness of the silicon nitride film 40 decreasing gradually from the tops of the source/drain diffused layers 32 positioned between the gate electrodes 20 toward the tops of the gate electrodes 20. Accordingly, the inclination of the surface of the silicon nitride film 40 becomes relatively blunt at the parts where the gate electrodes 20 are adjacent to each other. This contributes to preventing the generation of voids between the adjacent gate electrodes 20 when the silicon nitride films 42, 44 are formed in later steps. Thus etched-back silicon nitride film 40 itself is free from voids.

In such etching-back, the silicon nitride film is etched back by, e.g., 10-40 nm on the gate electrodes 20. The film thickness of the silicon nitride film 40 as thermally processed on the gate electrodes 20 becomes, e.g., about 10-40 nm.

When the film thickness of the silicon nitride film 40 on the gate electrodes 20 becomes excessively small, sufficient tensile stresses cannot be applied to the channel regions 37 of the NMOS transistors 36. Accordingly, it is preferable that the film thickness of the parts of the silicon nitride film 40 on the gate electrodes 20 is not made excessively small. Specifically, the film thickness of the silicon nitride film 40 as etched back on the gate electrodes 20 is preferably, e.g., about 5-15 nm.

Next, in the same way as in the semiconductor device manufacturing method according to the first embodiment described above with reference to FIG. 3C, UV cure is made on the silicon nitride film 40. The film thickness of the silicon nitride film 40 as UV-cured on the gate electrodes 20 becomes, e.g., about 10-40 nm.

Figure 15A:
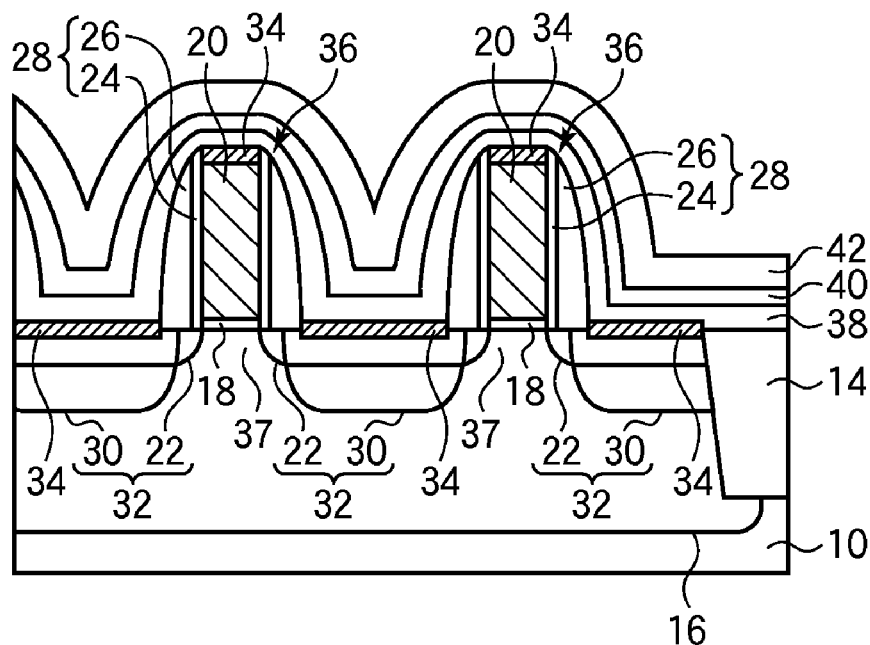
Figure 15B:
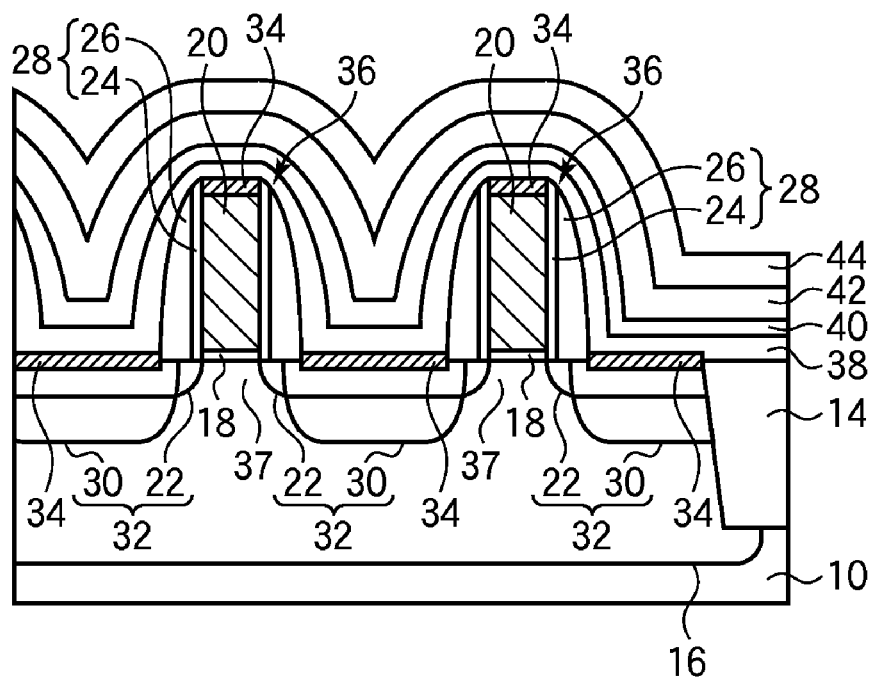
Figure 16A:
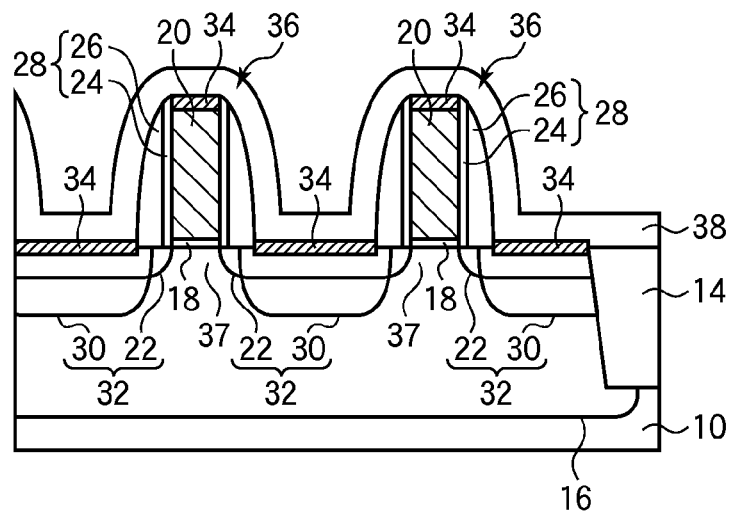
FIGS. 16A to 19 are cross-sectional views of a semiconductor device in the steps of the semiconductor device manufacturing method according to a third embodiment, which illustrate the method.
Figure 16B:
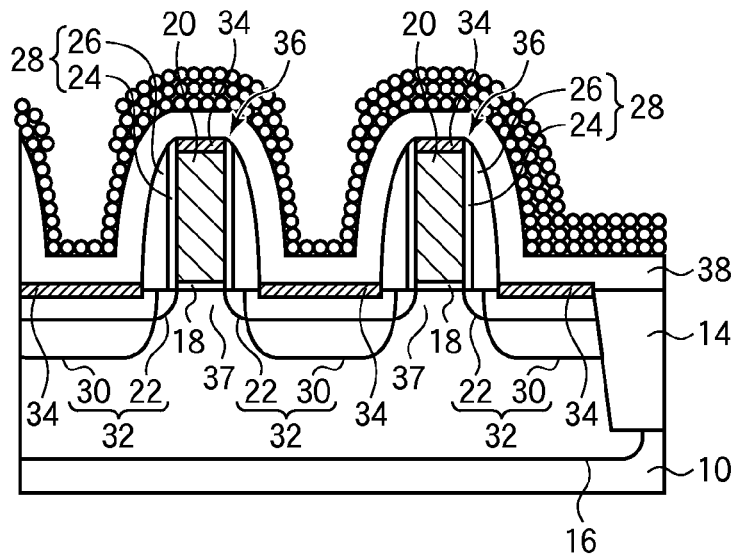
Figure 16C:
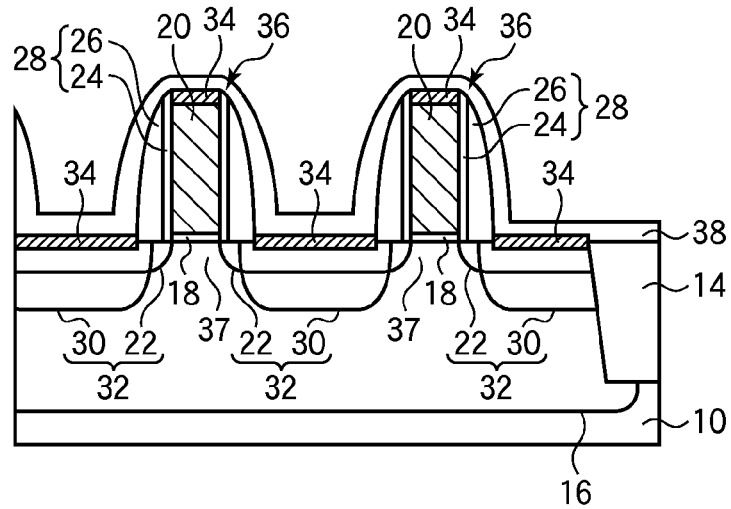
Figure 17A:
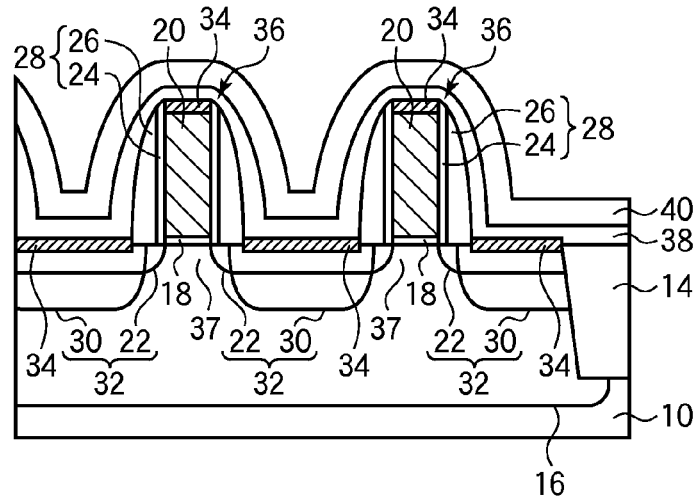
Figure 17B:
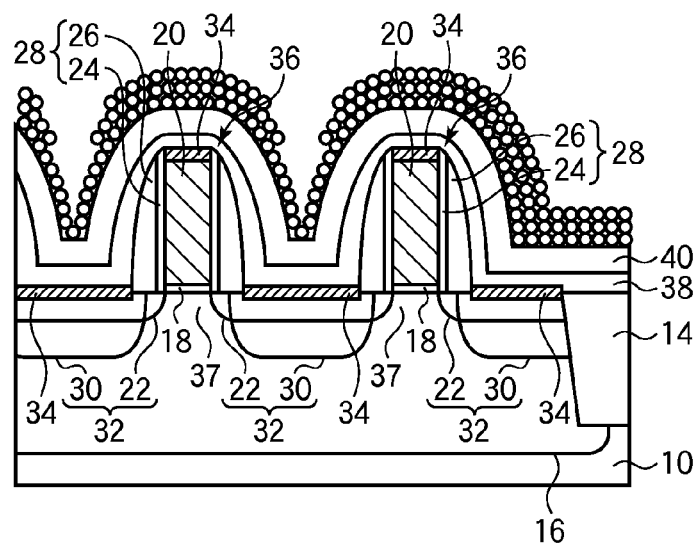
Figure 17C:
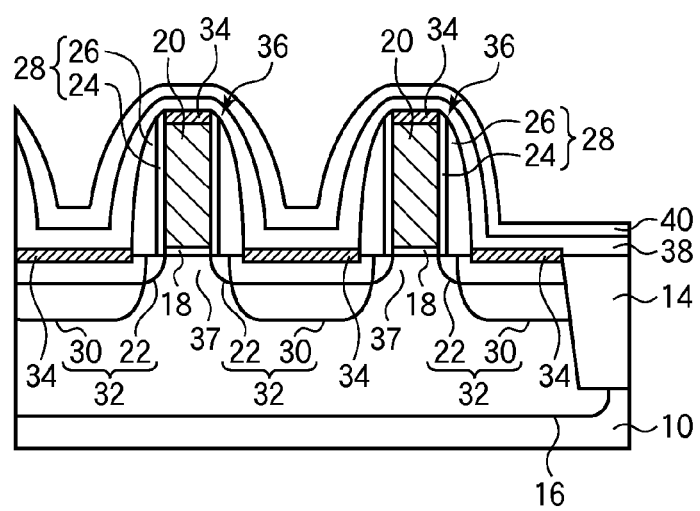

The semiconductor device manufacturing method hereafter is the same as that of the semiconductor device manufacturing method according to the first embodiment described above with reference to FIGS. 4B and 4C, and the description will not be repeated (see FIGS. 15A and 15B).

As described above, not only the first silicon nitride film 38 but also the second silicon nitride film 40 may be etched back with $NH_4F$ radicals.

[c] A Third Embodiment

The semiconductor device manufacturing method according to a third embodiment will be described with reference to FIGS. 16A to 19. FIGS. 16A to 19 are cross-sectional views of a semiconductor device in the steps of the semiconductor device manufacturing method according to the present embodiment, which illustrate the method. The same members of the present embodiment as those of the semiconductor device manufacturing method according to the first or the second embodiment illustrated in FIGS. 1A to 15B are represented by the same reference numbers not to repeat or to simplify the description.

The semiconductor device manufacturing method according to the present embodiment is characterized mainly in that not only the first silicon nitride film 38 and the second silicon nitride film 40 but also the third silicon nitride film 42 is etched back with $NH_4F$ radicals.

First, the steps of forming the device isolation regions 14 in the semiconductor substrate 10 to the step of forming the silicon nitride film 40 are the same as those of the semiconductor device manufacturing method described above with reference to FIGS. 1A to 4A, and their description will not be repeated (see FIGS. 16A to 17A).

Next, the step of supplying $NH_4F$ radical to the silicon nitride film 40 to the step of making UV cure on the silicon nitride film 40 are the same as those of the semiconductor device manufacturing method according to the second embodiment described above with reference to FIGS. 14B and 14C. The description of the step of supplying $NH_4F$ radical to the silicon nitride film 40 to the step of making UV cure on the silicon nitride film 40 will not be repeated (see FIGS. 17B and 17C).

Figure 18A:
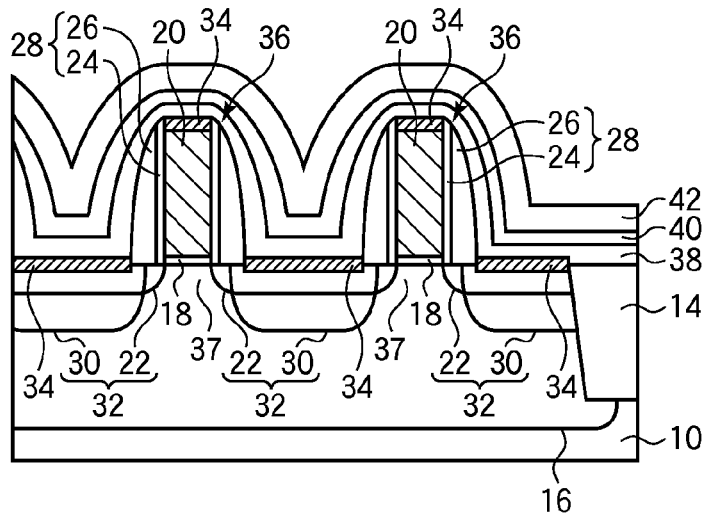

Next, in the same way as in the semiconductor device manufacturing method described above with reference to FIG. 4B, the silicon nitride film 42 is formed (see FIG. 18A).

Figure 18B:
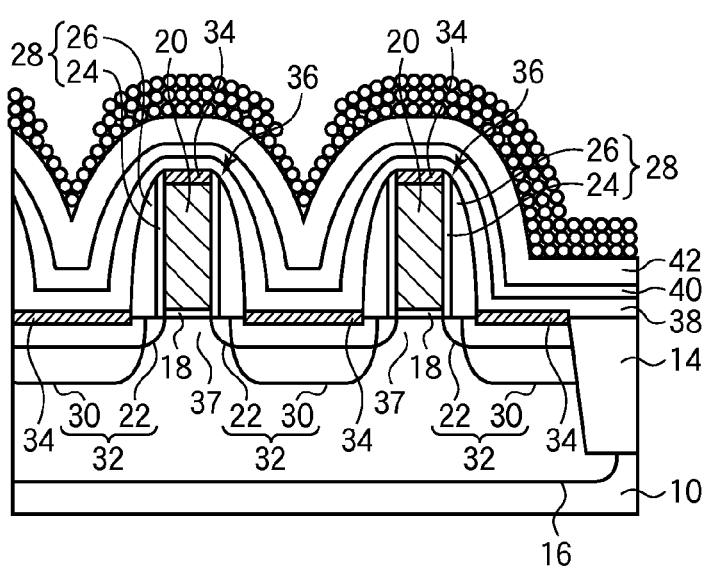

Next, in the same way as in the semiconductor device manufacturing method described above with reference to FIG. 3B, $NH_4F$ radicals as the etchant are supplied to the silicon nitride film 42 (see FIG. 18B).

Figure 18C:
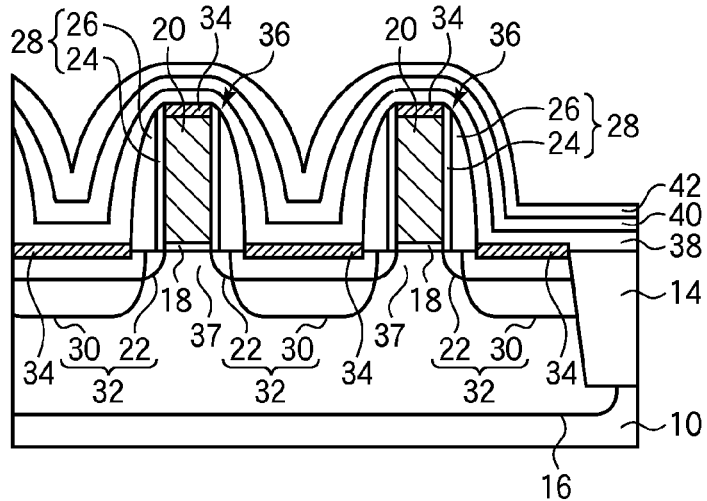

Next, in the same way as in the semiconductor device manufacturing method described above with reference to FIG. 3C, thermal processing is made on the silicon nitride film 42 to thereby etch back the silicon nitride film 42 (see FIG. 18C). At the parts of the silicon nitride film 42 positioned between the gate electrodes 20, a relatively small quantity of the etchant is supplied, the etched quantity of the silicon nitride film 42 is relatively small. On the other hand, at the parts of the silicon nitride film 42 other than the parts positioned between the gate electrodes 20, a relatively large quantity of the etchant is supplied, and the silicon nitride film 42 is etched relatively large. Accordingly, the silicon nitride film 42 resides with the film thickness of the silicon nitride film 42 decreasing gradually from the tops of the source/drain diffused layers 32 positioned between the gate electrodes 20 toward the tops of the gate electrodes 20. Accordingly, the inclination of the surface of the silicon nitride film 42 becomes relatively blunt at the parts where the gate electrodes 20 are adjacent to each other. This contributes to preventing the generation of voids between the gate electrodes adjacent to each other when the silicon nitride film 44 is formed in a later step. The thus etched back silicon nitride film 42 itself is free from voids.

The thus etched-back silicon nitride film 42 is etched back by, e.g., about 10-40 nm on the gate electrodes 20. The film thickness of the silicon nitride film 42 as etched back on the gate electrodes 20 is, e.g., about 10-40 nm.

When the film thickness of the silicon nitride film 42 on the gate electrodes 20 is excessively small, sufficient tensile stress cannot be applied to the channel regions 37 of the NMOS transistors 36. Accordingly, it is preferable not to make the film thickness of the parts of the silicon nitride film 42 on the gate electrode 20 excessively small. Specifically, it is preferable that the film thickness of the silicon nitride film 42 as etched back on the gate electrodes 20 is, e.g., 5-15 nm.

Next, in the same way as in the semiconductor device manufacturing method described above with reference to FIG. 3C, UV cure is made on the silicon nitride film 42. The film thickness of the silicon nitride film 42 as UV-cured on the gate electrodes 20 becomes, e.g., about 10-40 nm.

Figure 19:
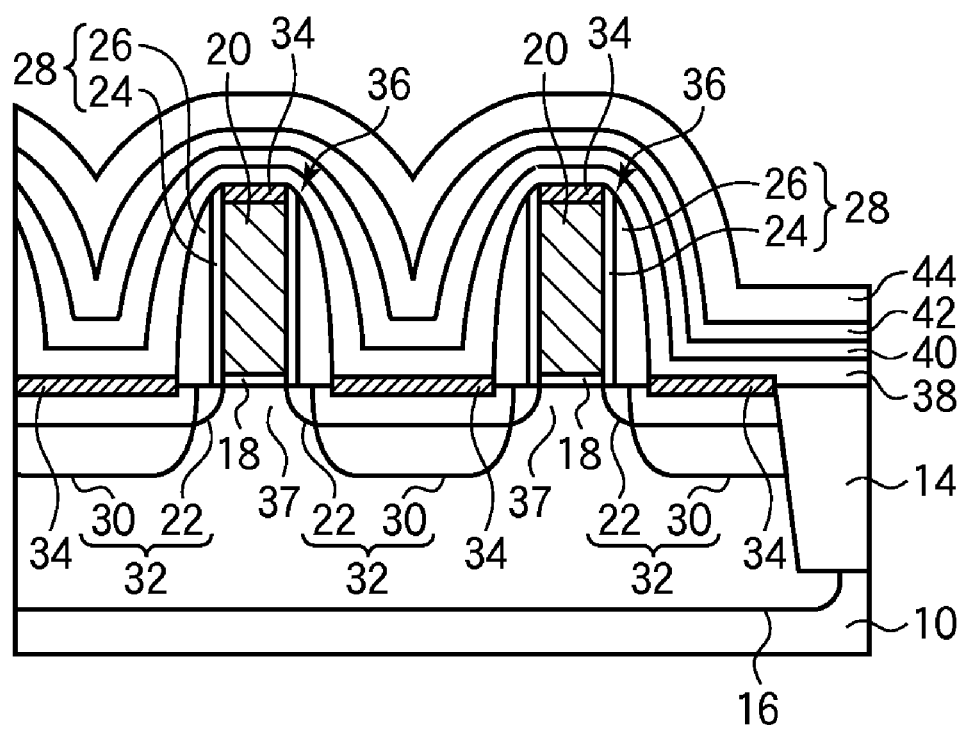

The process of the semiconductor device manufacturing method hereafter is the same as that of the semiconductor device manufacturing method according to the first embodiment described above with reference to FIG. 4C, and its description will not be repeated (see FIG. 19).

As described above, not only the first silicon nitride film 38 and the second silicon nitride film 40 but also the third silicon nitride film 42 may be etched back with $NH_4F$ radicals.

[d] A Fourth Embodiment

The semiconductor device manufacturing method according to a fourth embodiment will be described with reference to FIGS. 20A to 25. FIGS. 20A to 25 are cross-sectional views of a semiconductor device in the steps of the semiconductor device manufacturing method according to the present embodiment, which illustrate the method. The members of the present embodiment as those of the semiconductor device manufacturing method according to the first to the third embodiments illustrated in FIGS. 1A to 19 are represented by the same reference numbers not to repeat or to simplify their description.

The semiconductor device manufacturing method according to the present embodiment is characterized mainly in that the transistors 70 are PMOS transistors, and the stress films 72, 74, 76, 78 are compressive stress film.

Figure 20A:
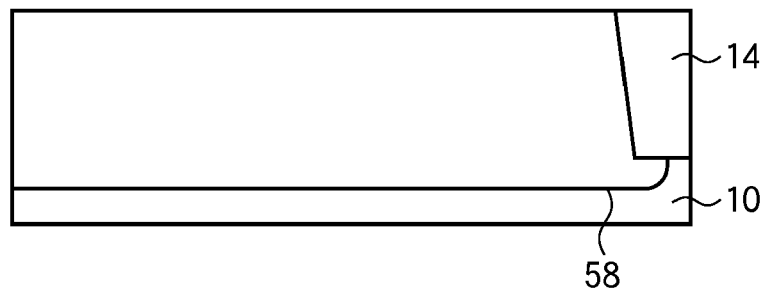
FIGS. 20A to 25 are cross-sectional views of a semiconductor device in the steps of the semiconductor device manufacturing method according to a fourth embodiment, which illustrate the method.

First, in the same way as in the semiconductor device manufacturing method according to the first embodiment described above with reference to FIG. 1A, the device isolation regions 14 for defining the devices regions are formed in the semiconductor substrate 10 (see FIG. 20A).

Next, an N-type dopant impurity is implanted into the semiconductor substrate 10 by, e.g., ion implantation to form N-type wells 58 in the semiconductor substrate 10. The dopant impurity is, e.g., P. The acceleration voltage is, e.g., 100-500 keV. The dose is, e.g., $1\times10^{13}$-$5\times10^{13}$ $cm^{-2}$.

Figure 20B:
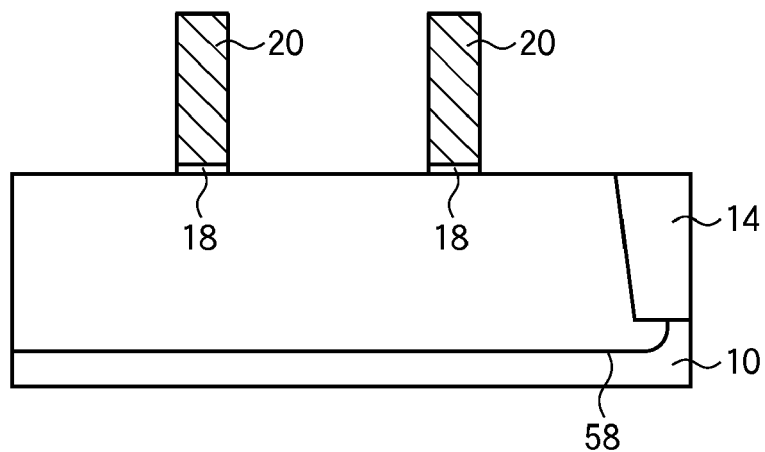
Figure 20C:
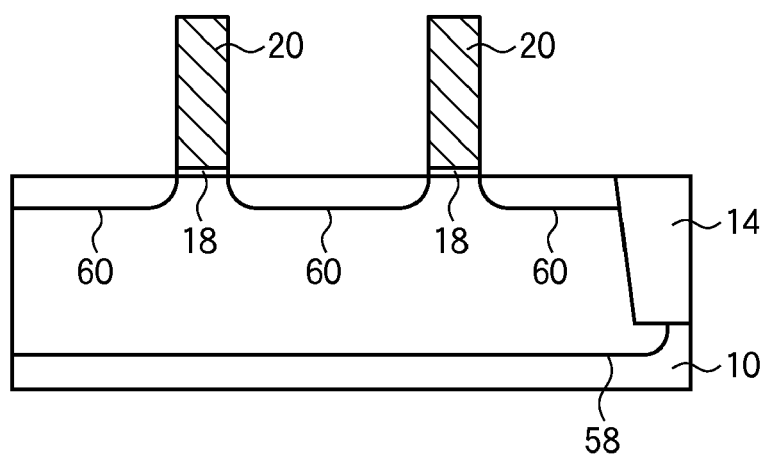

Next, in the same way as in the semiconductor device according to the first embodiment described above with reference to FIG. 1B, the gate insulation film 18 is formed (see FIG. 20B).

Next, in the same way as in the semiconductor device manufacturing method according to the first embodiment described above with reference to FIG. 1B, the gate electrodes 20 are formed.

Next, a P-type dopant impurity is implanted into the semiconductor substrate 10 on both sides of the gate electrodes 20 by, e.g., ion implantation with the gate electrodes 20 as the mask. The P-type dopant impurity is, e.g., B. The acceleration voltage is, e.g., 1-5 keV. The dose is, e.g., $1\times10^{15}$-$5\times10^{15}$ $cm^{-2}$. Thus, the extension regions 60 forming the shallow regions of the extension source/drain structure are formed (see FIG. 20C).

Figure 21A:
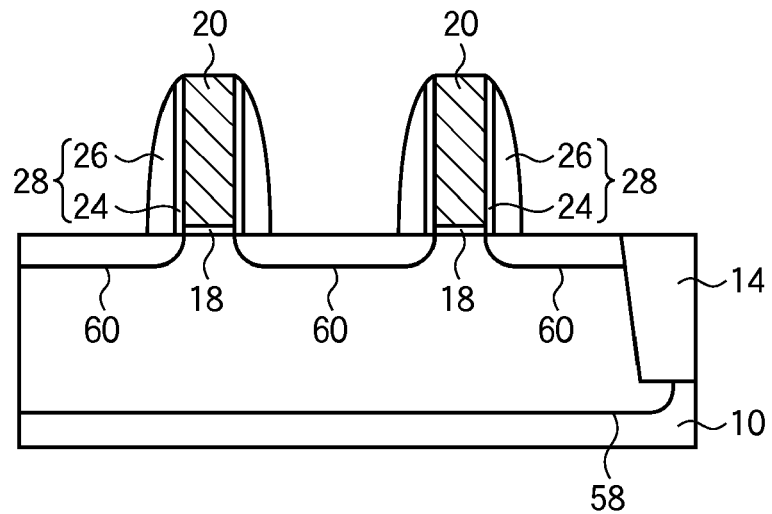
Figure 21B:
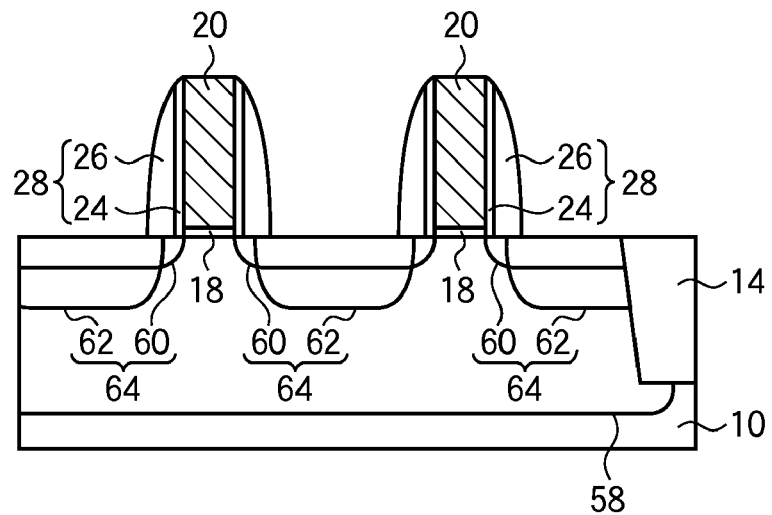
Figure 21C:
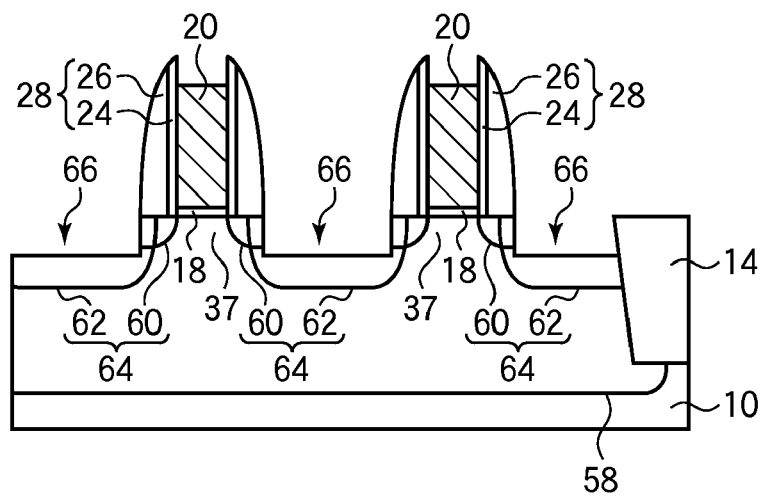

Next, in the same way as in the semiconductor device manufacturing method according to the first embodiment described above with reference to FIG. 2A, the sidewall insulation film 28 is formed (see FIG. 21A).

Then, a P-type dopant impurity is implanted into the semiconductor substrate 10 on the bodies of the gate electrodes 20 and the sidewall insulation film 28 by, e.g., ion implantation with the gate electrodes 20 and the sidewall insulation film 28 as the mask. The P-type dopant impurity is, e.g., B. The acceleration voltage is, e.g., 3-7 keV. The dose is, e.g., $3\times10^{15}$-$9\times10^{15}$ $cm^{-2}$. Thus, the impurity diffused regions 62 forming the deep regions of the extension source/drain structure are formed. The extension regions 60 and the impurity diffused regions 62 form the source/drain diffused layers 64 of the extension source/drain structure (see FIG. 21B).

The source/drain diffused layers 64 are formed before a silicon germanium layer 68 which will be described later is formed here, but the source/drain diffused layers 64 may be formed after the silicon germanium layer 68, which will be described later, may be formed.

Then, the semiconductor substrate 10 is etched by, e.g., RIE. The etching conditions are as exemplified below. The high frequency power to be applied is, e.g., about 100-600 W. The gas to be fed into the chamber is suitably selected out of $O_2$ gas, He gas, Ar gas, $CHF_3$ gas, $SF_6$ gas, HBr gas, $SiCl_4$ gas or others. The pressure inside the chamber is, e.g., about 1-20 mTorr. The etching period of time is, e.g., about 10-60 seconds. The substrate temperature is, e.g., 10-150° C. Thus, cavities 66 are formed in the source/drain diffused layers 64 on both sides of the gate electrodes 20 and the sidewall insulation film 28 (see FIG. 21C).

Figure 22A:
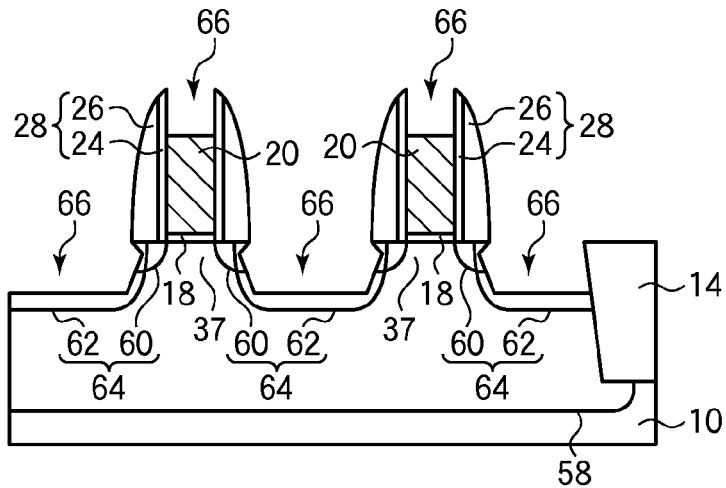
Figure 22B:
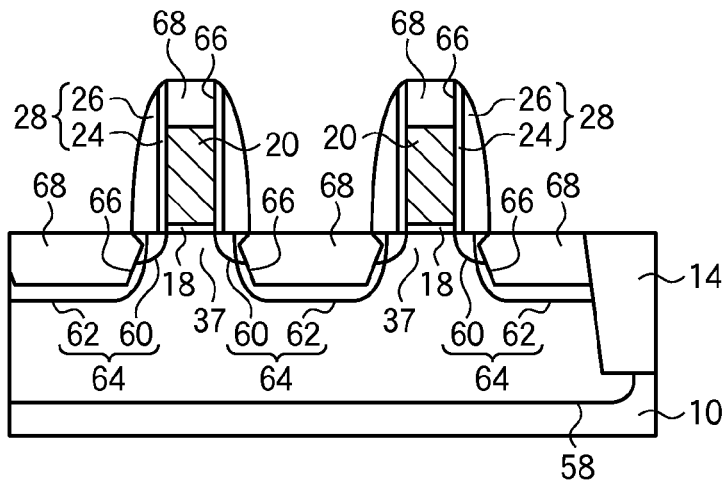

Next, the semiconductor substrate 10 is etched by, e.g., wet etching (FIG. 22A). The etchant can be an organic alkaline etchant, e.g., tetramethylammonium hydroxide (TMAH) aqueous solution, hydroxyethyltrimethylammoniumn hydroxide (CHOLINE) aqueous solution or others. The echant can be also ammonium hydroxide or others. The etching period of time is, e.g., about 10-90 seconds. The etched quantity is set at, e.g., about 5-25 nm. By this wet etching, the cavities 66 are formed down to the lower regions of the sidewall insulation film 28. At this time, the tops of the gate electrodes 20 are also etched, and accordingly the cavities 66 are formed also at the upper parts of the gate electrodes 20.

The cavities 66 may not be formed at the upper parts of the gate electrodes 20.

Then, in the cavities 66, a silicon germanium layer 68 is epitaxially grown with, e.g., a batch vertical furnace. The growth conditions for the silicon germanium layer 68 are as exemplified below. The raw material gas is, e.g., $H_2$ gas, $SiH_4$ gas, $GeH_4$ gas, HCl gas or others. The temperature inside the furnace is set at, e.g., 400-600° C. The processing period time is set at, e.g., about 5-10 hours.

Then, in the same way as in the semiconductor device manufacturing method according to the first embodiment described above with reference to FIG. 2C, the silicide film 34 is formed. The silicide film 34 on the silicon germanium layer 68 functions as the source/drain electrodes.

Figure 22C:
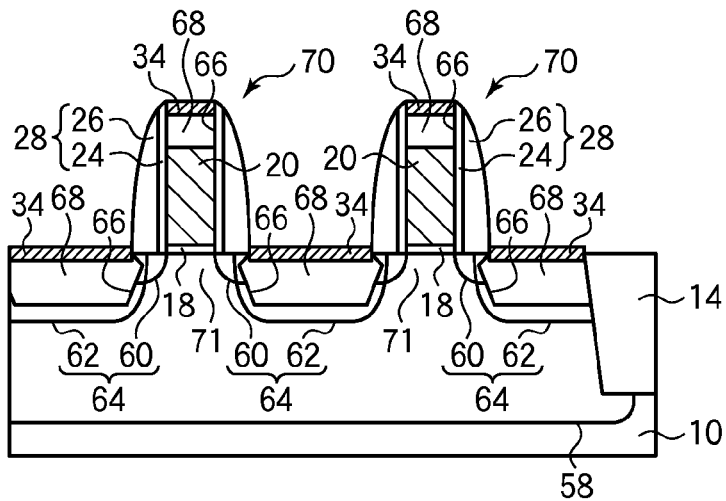

Thus, PMOS transistors 70 each including the gate electrode 20 and the source/drain diffused layer 64 are formed (see FIG. 22C).

Figure 23A:
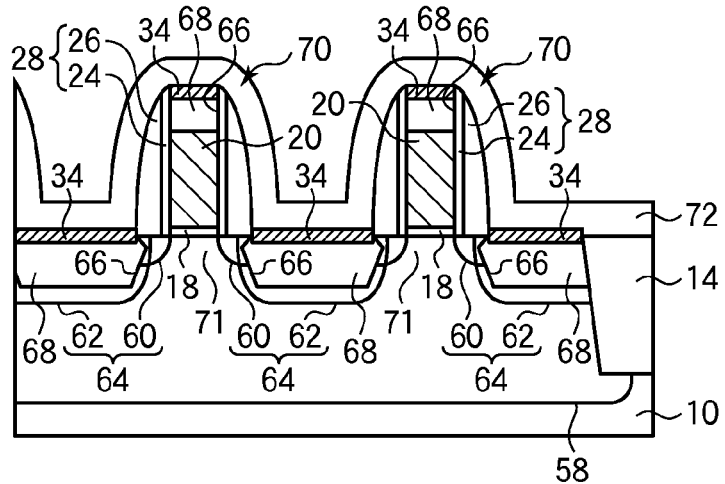

Then, on the entire surface, the first silicon nitride film 72 is formed (see FIG. 23A). More specifically, the silicon nitride film 72 is formed by plasma-enhanced CVD. The silicon nitride film 72 functions as the compressive stress film which applies compressive stresses to the channel regions 71 of the transistors 70. The first silicon nitride film 72 applies compressive stresses to the channel regions 71 of the transistors 70 together with the second silicon nitride film 74, the third silicon nitride film 76 and the fourth silicon nitride film 78. The first silicon nitride film 72 and the silicon nitride films 74, 76, 78, which are formed in later steps, are a part of the compressive stress film formed of the layer film of silicon nitride films, i.e., a partial film. The film thickness of the silicon nitride film 72 is set at, e.g., about 10-90 nm. Into the film forming chamber, $SiH_4$ gas and $NH_3$ gas, for example, are fed. The flow rate of the $SiH_4$ gas is set at, e.g., about 20-80 sccm. The flow rate of the $NH_3$ gas is set at, e.g., about 80-120 sccm. The pressure inside the film forming chamber is, set at., e.g., about 1.0-4.0 Torr. The pressure inside the film forming chamber is set at e.g., about 2.0 Torr here. The substrate temperature is set at, e.g., about 300-500° C. The low frequency power to be applied is set at, e.g., about 10-60 W. The high frequency power to be applied is set at, e.g., about 40-140 W. The film forming period of time is set at, e.g., about 50-150 seconds.

Figure 23B:
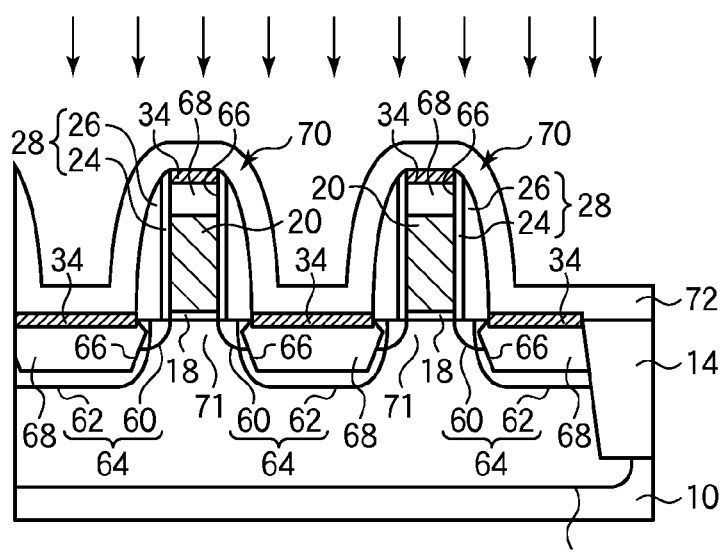

Then, oxygen ($O_2$) plasma processing is made on the silicon nitride film 72 (see FIG. 23B). The oxygen plasma processing is for improving the etching rate of the silicon nitride film 72. The compressive stress film 72 is hard in comparison with the tensile stress film 38, and its etching rate is low. Accordingly, it is preferable to make oxygen plasma processing on the compressive stress film 72. The conditions for the oxygen plasma processing are as follows: As the gas to be fed into the chamber is, oxygen gas and argon (Ar) gas, for example, are used. The flow rate of the oxygen gas is set at, e.g., about 10-50 sccm. The flow rate of the Ar gas is set at, e.g., about 50-150 sccm. The high frequency power to be applied is set at, e.g., about 1000-3000 W. The high frequency power to be applied is set at, e.g., about 2000 W here. The oxygen plasma processing period of time is set at, e.g., about 5-20 seconds. The etched quantity of the compressive stress film 72 by the oxygen plasma is, e.g., about 1-8 nm.

Figure 23C:
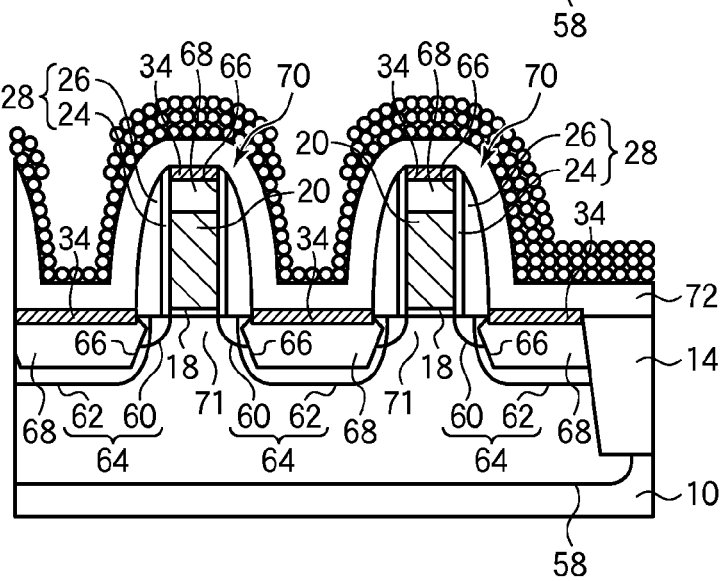

Next, in the same way as in the semiconductor deice manufacturing method described above with reference to FIG. 3B, the $NH_4F$ radicals as the etchant are supplied to the silicon nitride film 72 (see FIG. 23C). The period of time of supplying the etchant to the silicon nitride film 72, i.e., the etching period of time is set at, e.g., about 60-90 seconds.

Figure 24A:
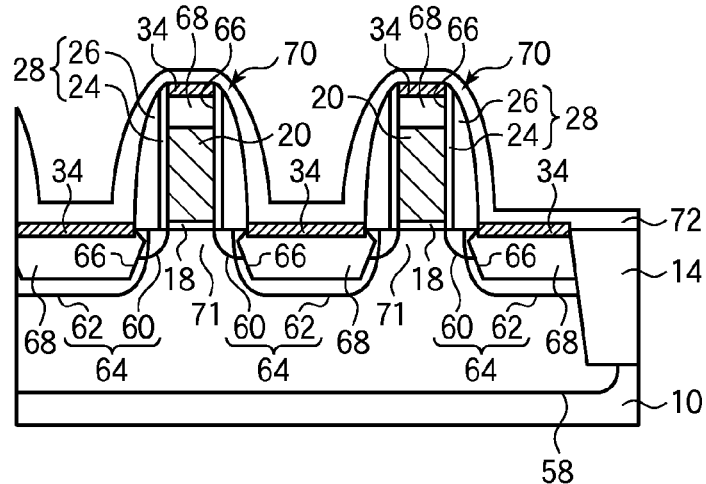

Then, in the same way as in the semiconductor device manufacturing method described above with reference to FIG. 3C, thermal processing is made on the silicon nitride film 72 to thereby etch back the silicon nitride film 72 (see FIG. 24A). At the parts of the silicon nitride film 72 positioned between the gate electrodes 20, a relatively small quantity of etchant is supplied, the etched quantity of the silicon nitride film 72 is relatively small. On the other hand, at the parts of the silicon nitride film 72 other than the parts positioned between the gate electrodes 20, a relatively large quantity of the etchant is supplied, and the silicon nitride film 72 is etched relatively large. Accordingly, the silicon nitride film 72 resides with the film thickness of the silicon nitride film 72 decreased gradually from the tops of the source/drain diffused layers 32 positioned between the gate electrodes 20 toward the tops of the gate electrodes 20. Accordingly, the inclination of the surface of the silicon nitride film 72 at the parts where the gate electrodes 20 are adjacent to each other becomes relatively blunt. This contributes to preventing the generation of voids between the gate electrodes 20 adjacent to each other in forming the silicon nitride films 74, 76, 78 in later steps. The thus etched-back silicon nitride film 72 itself is also free from voids.

Such etching-back etches back the silicon nitride film 72 at the tops of the gate electrodes 20 by, e.g., about 10-40 nm. The film thickness of the silicon nitride film 72 on the gate electrode 20 after etched back is set at, e.g., about 10-40 nm.

When the film thickness of the silicon nitride film 72 at the tops of the gate electrodes 20 becomes excessively small, sufficient compressive stresses cannot be applied to the channel regions 71 of the PMOS transistors 70. Accordingly, it is preferable not to make excessively small the film thickness of the silicon nitride film 72 on the gate electrodes 20. Specifically, it is preferable that the film thickness of the silicon nitride film 72 after etched back on the gate electrodes 20 is, e.g., 5-15 nm.

Figure 24B:
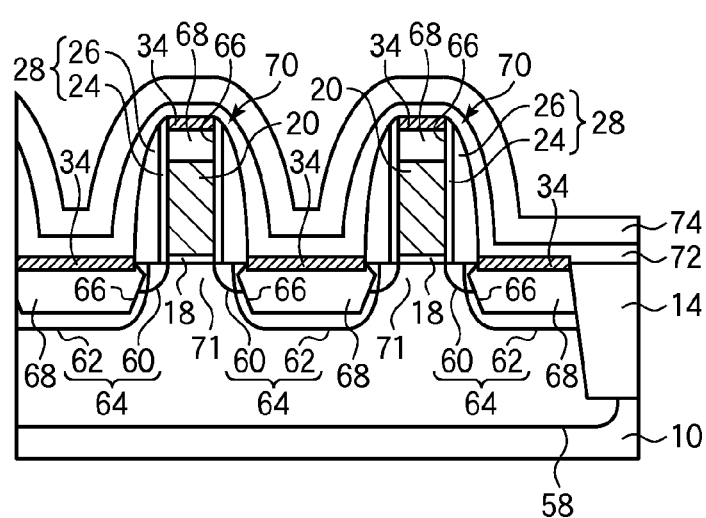

Next, in the same way as in the forming method of the silicon nitride film 72 described above with reference to FIG. 23A, the second silicon nitride film 74 is formed (see FIG. 24B). The film thickness of the silicon nitride film 74 is set at, e.g., 10-50 nm. No voids are formed in the silicon nitride film 74, which has been formed on the silicon nitride film 72 etched back as described above.

Figure 24C:
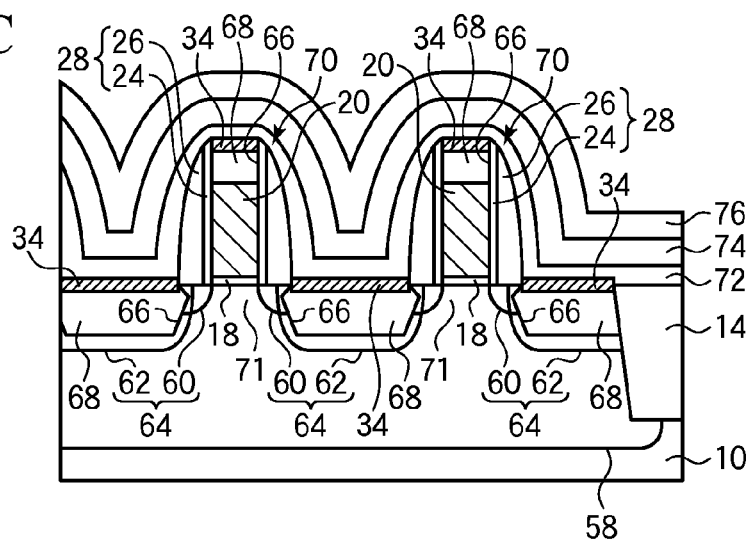

Then, in the same way as in the forming method of the silicon nitride film 72 described above with reference to FIG. 23A, the third silicon nitride film 76 is formed (see FIG. 24C). The film thickness of the silicon nitride film 76 is set at, e.g., 10-50 nm. The silicon nitride films 74, 76 are stacked on the silicon nitride film 72 etched back as described above, and accordingly no voids are formed in the silicon nitride film 76.

Figure 25:
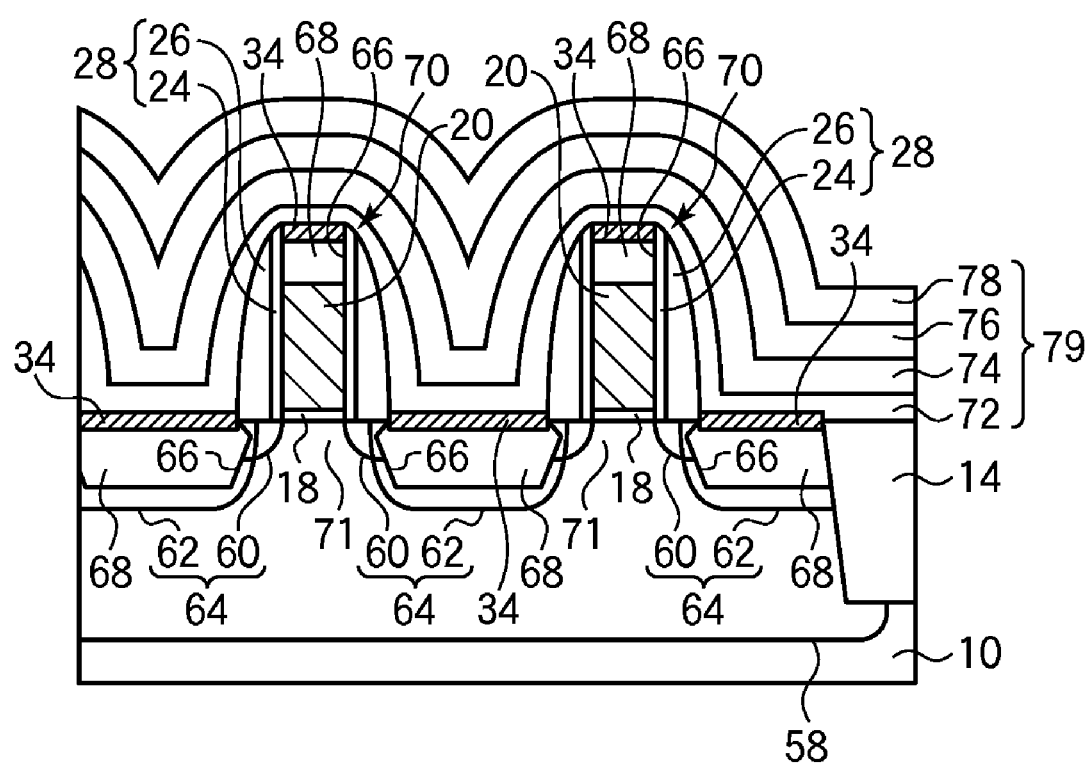

Then, in the same way as in the forming method of the silicon nitride film 72 described above with reference to FIG. 23A, the fourth silicon nitride film 78 is formed (see FIG. 25). The film thickness of the silicon nitride film 78 is set at, e.g., 10-50 nm. The silicon nitride films 74, 76, 78 are stacked on the silicon nitride film 72 etched back as described above, and accordingly no voids are formed in the silicon nitride film 78.

Thus, the compressive stress film 79 formed of the layer film of the silicon nitride films 72, 74, 76, 78 is formed, covering the PMOS transistors 70.

Thus, the semiconductor device of the present embodiment is manufactured.

As described above, the transistors 70 may be PMOS transistors, and the stress films 72, 74, 76, 78 may be compressive stress film. Furthermore, according to the present embodiment, oxygen plasma processing is made on the silicon nitride film 72, whereby the silicon nitride film 72 can be etched back at a relatively high etching rate.

Modifications

Next, the semiconductor device manufacturing method according to a modification of the present embodiment will be described with reference to FIGS. 26A to 29. FIGS. 26A to 29 are sectional views of a semiconductor device in the steps of the semiconductor device manufacturing method according to the present modification, which illustrate the method.

The semiconductor device manufacturing method according to the present modification is characterized mainly in that the silicon nitride film 72 is etched back separately twice.

Figure 26A:
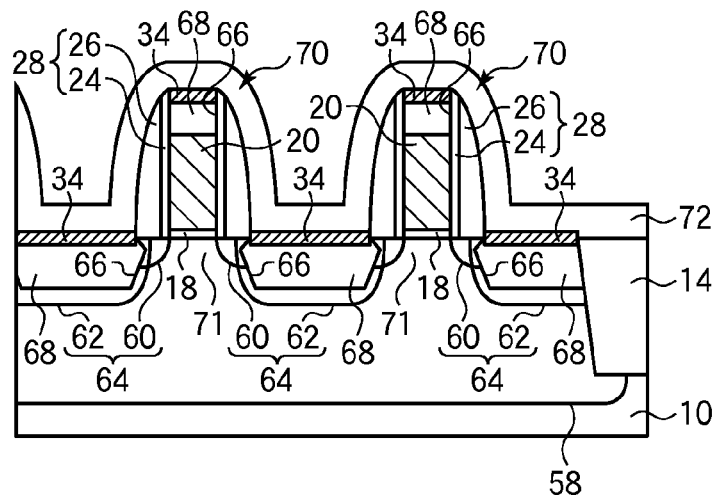
FIGS. 26A to 29 are cross-sectional views of a semiconductor device in the steps of the semiconductor device manufacturing method according to a modification of the fourth embodiment, which illustrate the method.
Figure 26B:
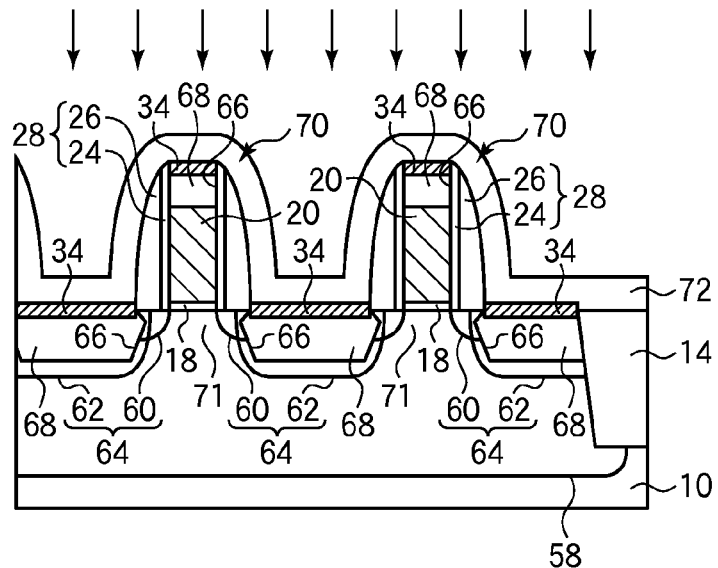

First, the step of forming the device isolation regions 14 to the steps of making oxygen plasma processing on the silicon nitride film 72 are the same as those of the semiconductor device manufacturing method according to the fourth embodiment illustrated in FIGS. 20A to 23B, and their description will not be repeated (see FIGS. 26A and 26B).

Figure 26C:
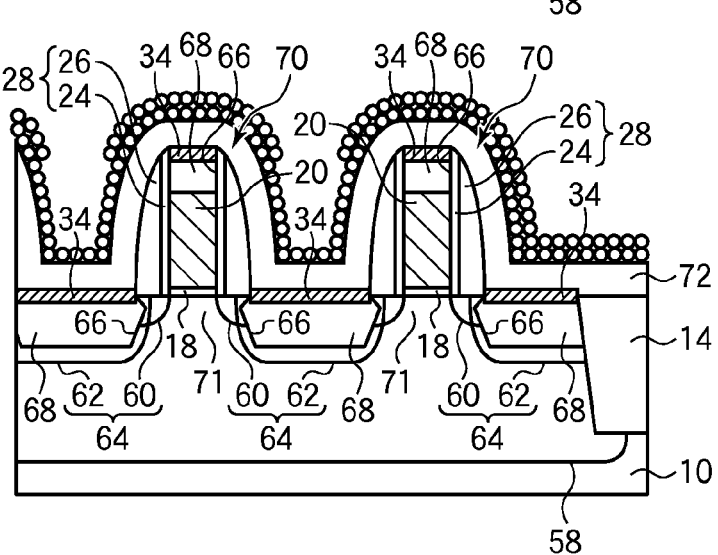

Then, in the same way as in the semiconductor device manufacturing method according to the fourth embodiment described above with reference to FIG. 23C, $NH_4F$ radials as the etchant are supplied to the silicon nitride film 72 (see FIG. 26C). In the present modification, the silicon nitride film 72 is etched back separately twice, and the first etching period of time can be about a half of that of the fourth embodiment. The etching period of time for the first etching is set at, e.g., 30-50 seconds here. The etching conditions other than the etching period of time are the same as the etching conditions for the silicon nitride film 72 described above with reference to FIG. 23C.

Figure 27A:
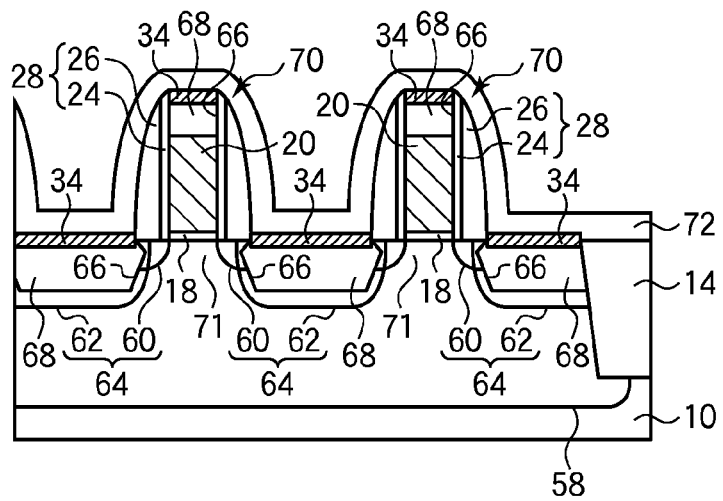

Then, in the same way as in the semiconductor device manufacturing method according to the fourth embodiment described above with reference to FIG. 24A, thermal processing is made on the silicon nitride film 72 (see FIG. 27A). To the parts of the silicon nitride film positioned between the gate electrodes 20, a relatively small quantity of the etchant is supplied, and the etched quantity of the silicon nitride film 72 becomes small. On the other hand, to the parts of the silicon nitride film 72 other than the parts positioned between the gate electrodes 20, a relatively large quantity of the etchant is supplied, and the silicon nitride film 72 is etched relatively large. Accordingly, the silicon nitride film 72 resides with the film thickness of the silicon nitride film 72 decreasing gradually from the tops of the source/drain diffused layers 32 positioned between the gate electrodes 20 toward the tops of the gate electrodes 20. Accordingly, the inclination of the surface of the silicon nitride film 72 at the parts where the gate electrodes 20 are adjacent to each other becomes relatively blunt.

Thus, the first etch-back is made on the silicon nitride film 72. Such etching-back etches the silicon nitride film 72 on the gate electrodes 20 by, e.g., about 5-35 nm. The film thickness of the silicon nitride film after the first etch-back is set at, e.g., about 10-40 nm.

Figure 27B:
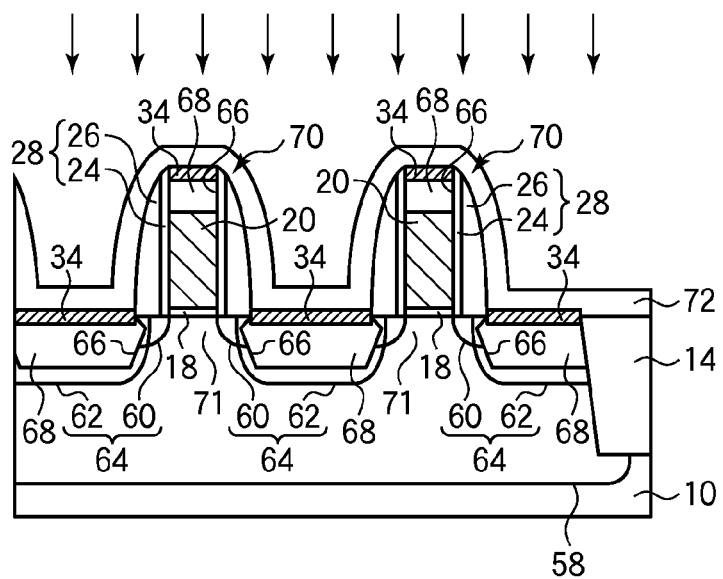

Next, in the same way as in the semiconductor device manufacturing method according to the fourth embodiment described above with reference to FIG. 23B, oxygen plasma processing is made on the silicon nitride film 72 (see FIG. 27B). The etched quantity of the silicon nitride film 72 by the oxygen plasma is, e.g., about 1-8 nm.

Figure 27C:
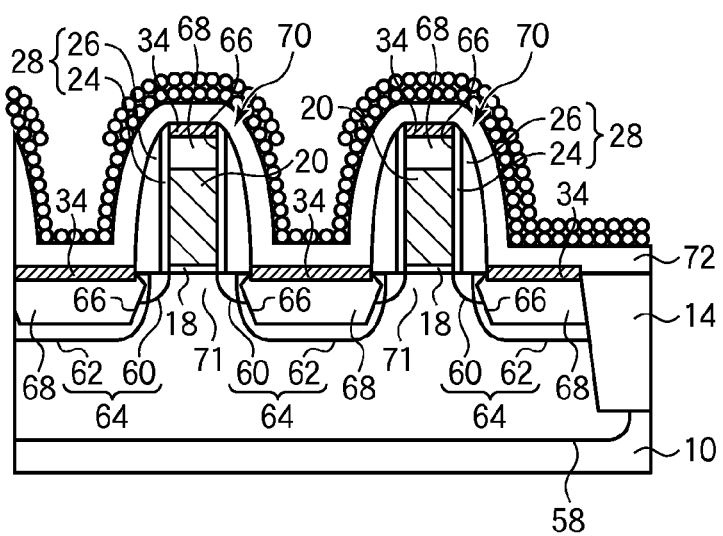

Next, in the same way as in the semiconductor device manufacturing method according to the fourth embodiment described above with reference to FIG. 23C, $NH_4F$ radicals as the etchant are supplied to the silicon nitride film 72 (see FIG. 27C). As described above, the silicon nitride film 38 are etched back separately twice, and the etching period of time for the once etch-back may be about a half of that of the fourth embodiment. The etching period of time for the second etching is set at, e.g., 30-50 seconds. The etching conditions other than the etching period of time are the same as the etching conditions for the silicon nitride film 72 described above with reference to FIG. 23C.

Figure 28A:
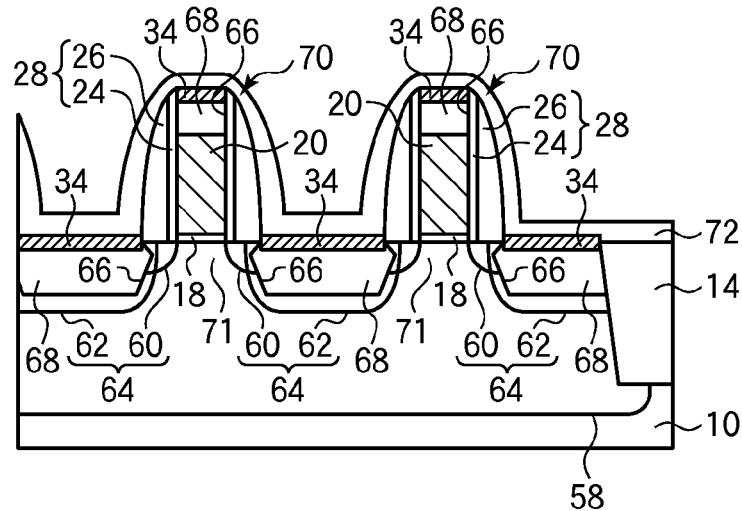

Next, in the same way as in the semiconductor device manufacturing method according to the fourth embodiment described above with reference to FIG. 24A, thermal processing is made on the silicon nitride film 72 (see FIG. 28A). To the parts of the silicon nitride film positioned between the gate electrodes 20, a relatively small quantity of the etchant is supplied, and the etched quantity of the silicon nitride film 72 becomes relatively small. On the other hand, to the parts of the silicon nitride film 72 other than the parts positioned between the gate electrodes 20, a relatively large quantity of the etchant is supplied, the silicon nitride film 72 is etched relatively large. Accordingly, the silicon nitride film 72 resides with the film thickness of the silicon nitride film 72 decreasing from the tops of the source/drain diffused layers 32 positioned between the gate electrodes 20 toward the tops of the gate electrodes 20. Accordingly, the inclination of the surface of the silicon nitride film 72 becomes relatively blunt at the parts where the gate electrodes are adjacent to each other. This contributes to preventing the generation of voids between the adjacent gate electrodes 20 when the silicon nitride films 74, 76, are formed in later steps. The thus etched-back silicon nitride film 72 itself is free from voids.

Thus, the second etch-back is made on the silicon nitride film 72. Such etching-back etches back the silicon nitride film 72 on the gate electrodes 20 by, e.g., about 5-35 nm. The film thickness of the silicon nitride film 72 after the second etch-back is set at, e.g., about 10-40 nm.

Thus, the etch-back is made on the silicon nitride film 72 separately twice.

Figure 28B:
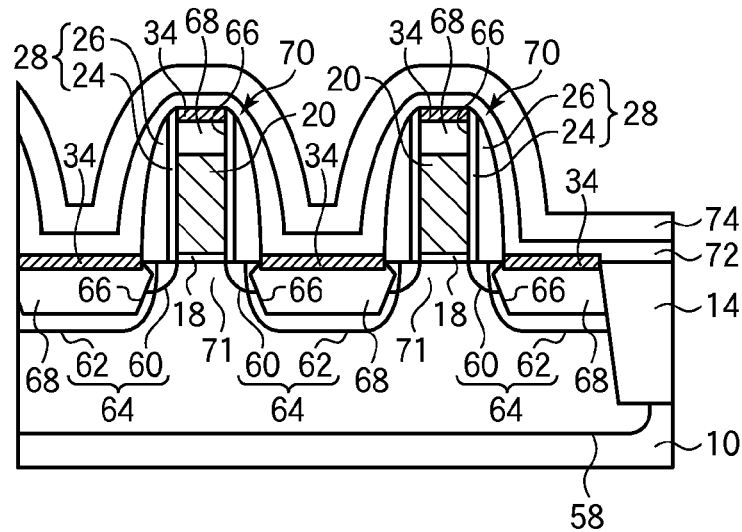
Figure 28C:
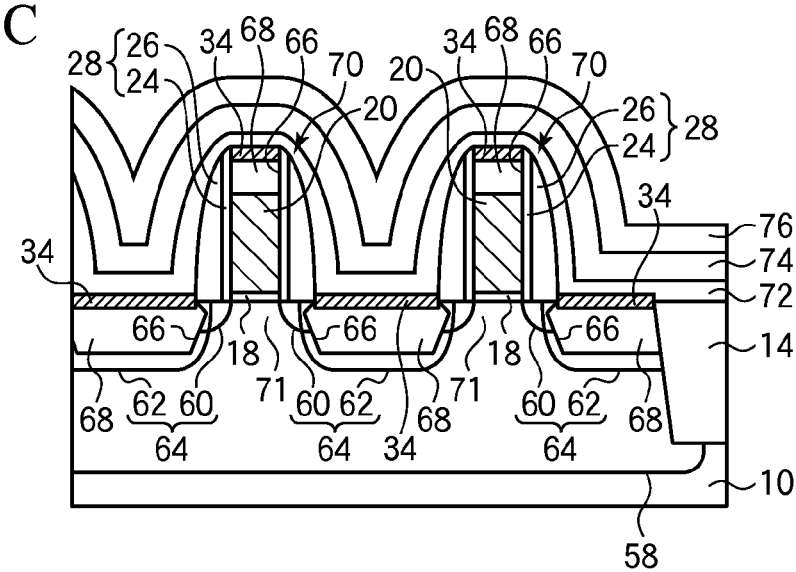
Figure 29:
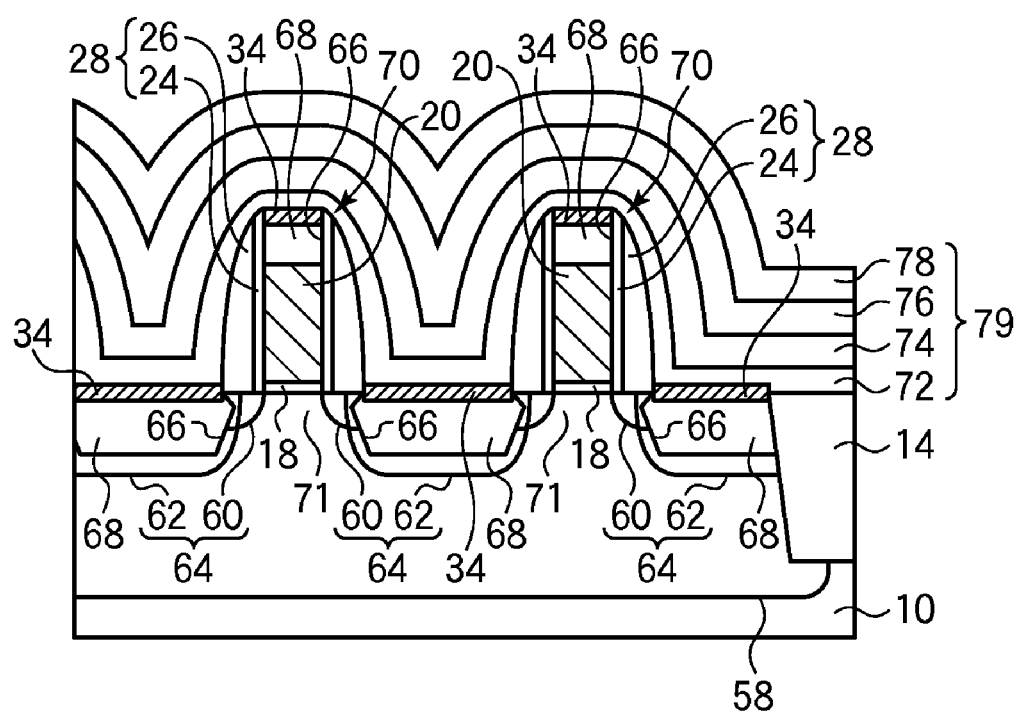
Figure 30A:
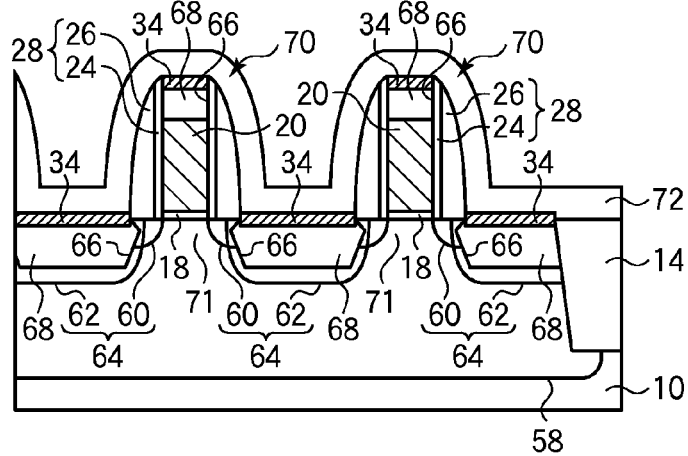
FIGS. 30A to 33 are cross-sectional views of a semiconductor device in the steps of the semiconductor device manufacturing method according to a fifth embodiment, which illustrate the method.
Figure 30B:
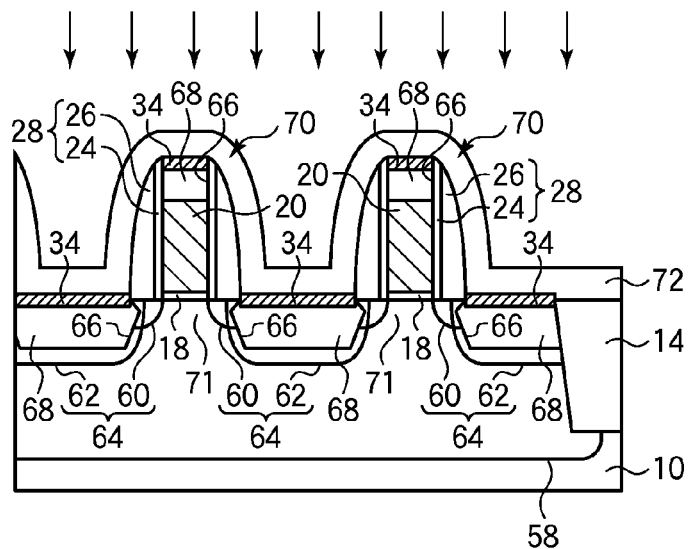
Figure 30C:
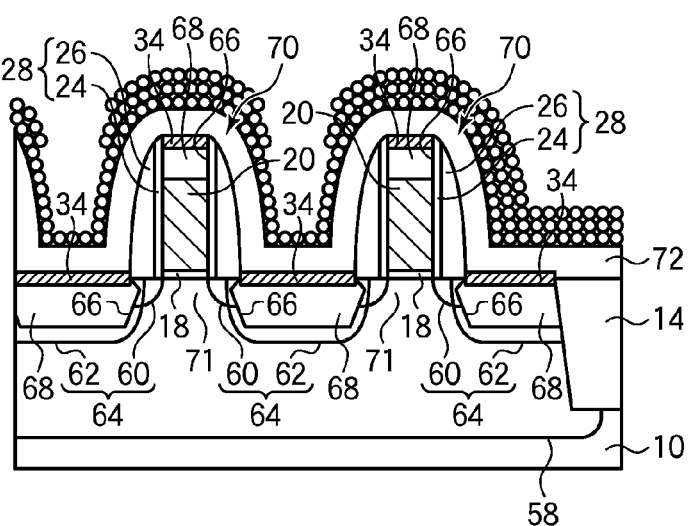
Figure 31A:
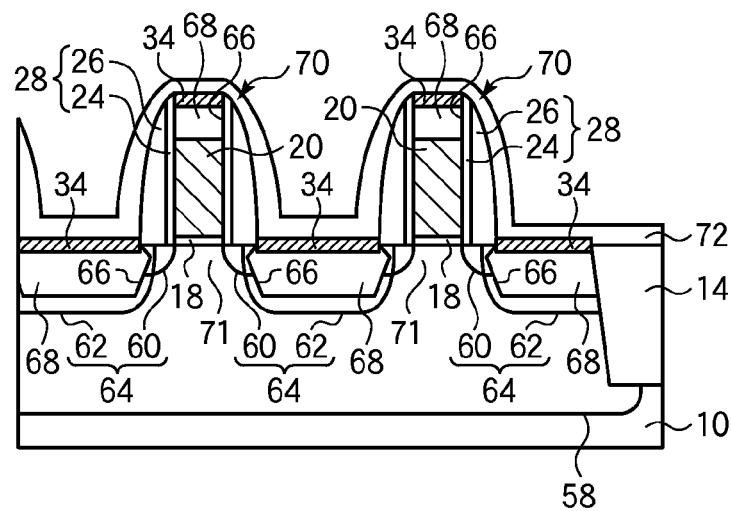
Figure 31B:
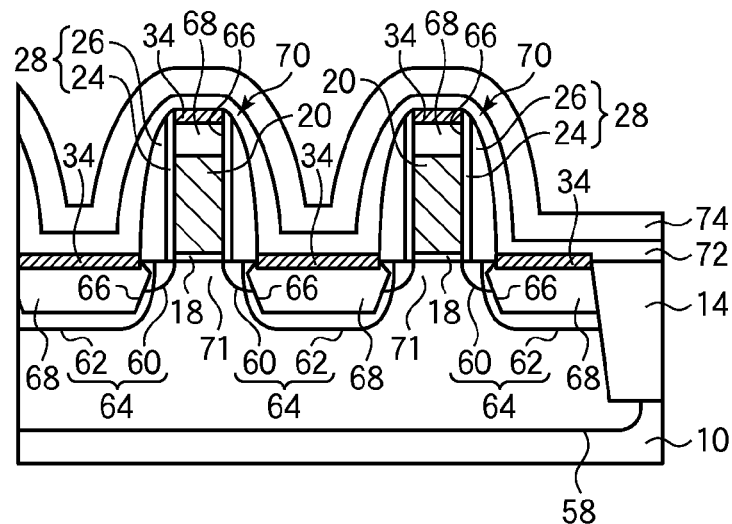
Figure 31C:
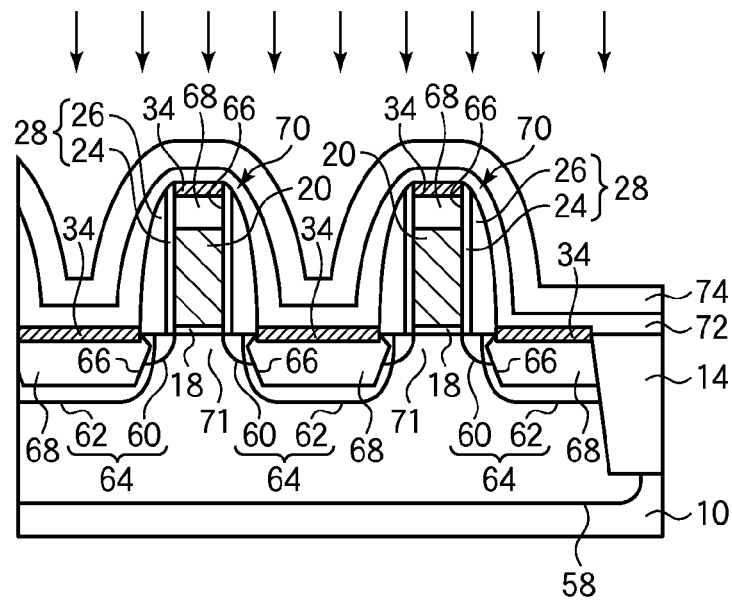

The process of the semiconductor device manufacturing method following hereafter is the same as that of the semiconductor device manufacturing method according to the fourth embodiment described above with reference to FIGS. 24B and 25, and the description will not be repeated (see FIGS. 28B to 29).

As described above, the etch-back of the silicon nitride film 72 may be made separately twice.

[e] A Fifth Embodiment

The semiconductor device manufacturing method according to a fifth embodiment will be described with reference to FIGS. 30A to 33. FIGS. 30A to 33 are cross-sectional views of a semiconductor device in the steps of the semiconductor device manufacturing method according to the present embodiment, which illustrate the method. The same members of the present embodiment as those of the semiconductor device manufacturing method according to the first to the fourth embodiments illustrated in FIGS. 1A to 29 are represented by the same reference numbers not to repeat or to simplify their description.

The semiconductor device manufacturing method according to the present embodiment is characterized mainly in that not only the first silicon nitride film 72 but also the second silicon nitride film 74 is etched back with $NH_4F$ radicals.

First, the steps of forming the device isolation regions 14 in the semiconductor substrate 10 to the step of forming the silicon nitride film 74 are the same as those of the semiconductor device manufacturing method according to the fourth embodiment described above with reference to FIGS. 20A to 24B, and their description will not be repeated (see FIGS. 30A to 31B).

Next, in the same way as in the semiconductor device manufacturing method according to the fourth embodiment described above with reference to FIG. 23B, oxygen plasma processing is made on the silicon nitride film 74 (see FIG.

31C). The etched quantity of the silicon nitride film 74 by the oxygen plasma processing is, e.g., about 1-8 nm.

Figure 32A:
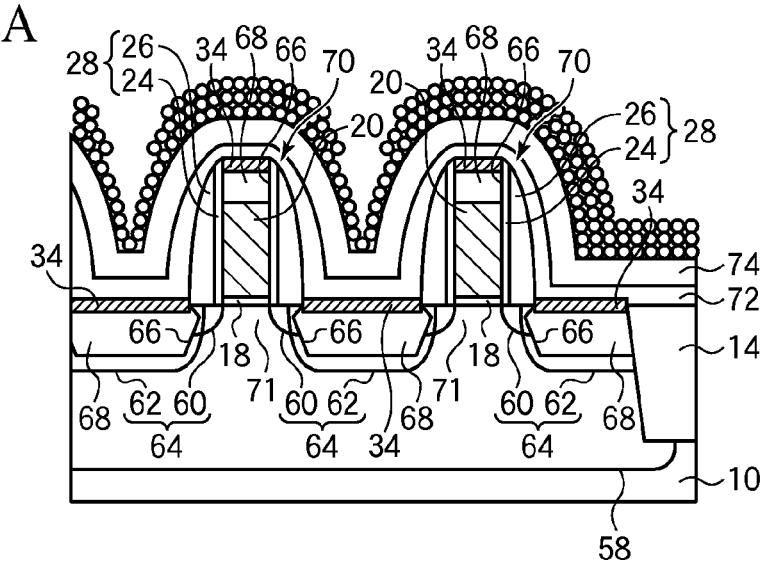

Next, in the same way as in the semiconductor device manufacturing method according to the fourth embodiment descried above with reference to FIG. 23C, NH$_4$F radicals as the etchant are supplied to the silicon nitride film 74 (see FIG. 32A).

Figure 32B:
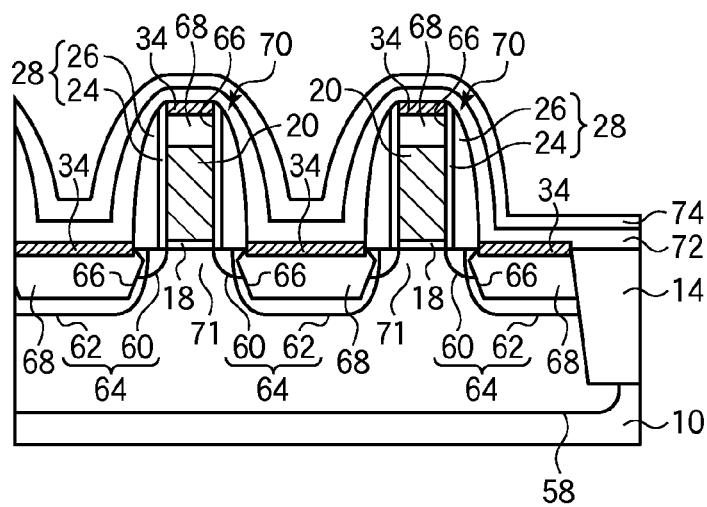

Then, in the same way as in the semiconductor device manufacturing method according to the fourth embodiment described above with reference to FIG. 24A, thermal processing is made on the silicon nitride film 74 (see FIG. 32B). To the parts of the silicon nitride film positioned between the gate electrodes 20, a relatively small quantity of the etchant is supplied, and the etched quantity of the silicon nitride film 74 becomes accordingly relatively small. On the other hand, to the parts of the silicon nitride film 74 other than the parts positioned between the gate electrodes 20, the etchant is supplied in a relatively large quantity, and accordingly, the silicon nitride film 74 is etched relatively large. Accordingly, the film thickness of the silicon nitride film 74 resides with the film thickness of the silicon nitride film 74 decreasing gradually from the tops of the source/drain diffused layers 32 positioned between the gate electrodes 20 toward the tops of the gate electrodes 20. Thus, the inclination of the surface of the silicon nitride film 74 becomes relatively blunt at the parts where the gate electrodes 20 are adjacent to each other. This contributes to preventing the generation of voids between the adjacent gate electrodes 20 when the silicon nitride films 76, 78 are formed in later steps. No voids are formed in the thus etched-back silicon nitride film 74 itself.

Thus, the etch-back is made on the silicon nitride film 74. Such etch-back etches back the silicon nitride film 74 on the gate electrodes 20 by, e.g., about 5-35 nm. The film thickness of the silicon nitride film 74 after etched back is set at, e.g., about 10-40 nm.

When the film thickness of the silicon nitride film 74 on the gate electrodes 20 is excessively small, sufficient compressive stresses cannot be applied to the channel regions 71 of the PMOS transistors 70. Accordingly, it is preferable not to make excessively small the film thickness of the silicon nitride film 74 on the gate electrodes 20. Specifically, the film thickness of the silicon nitride film 74 on the gate electrode 20 after etched back is preferably, e.g., 5-15 nm.

Figure 32C:
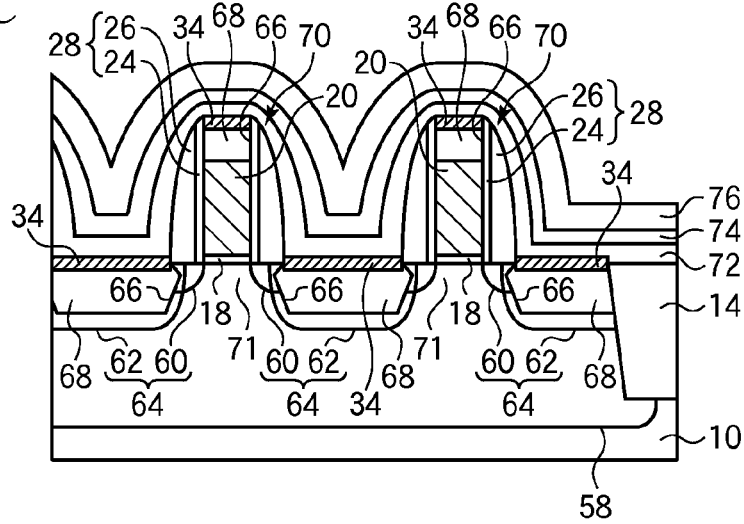
Figure 33:
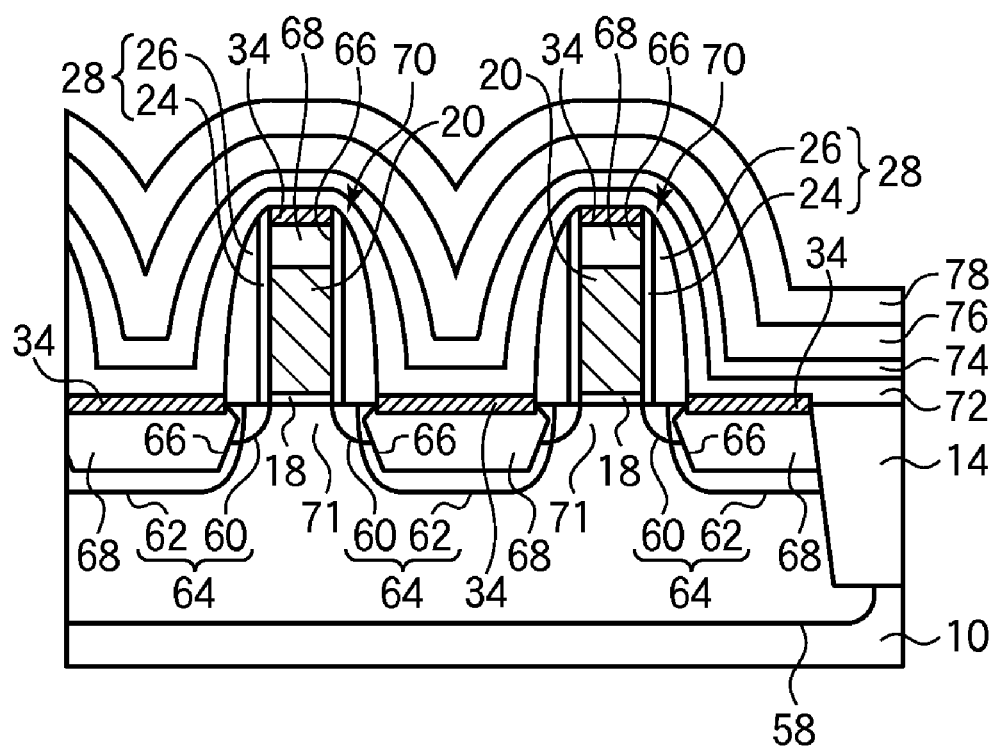
Figure 34A:
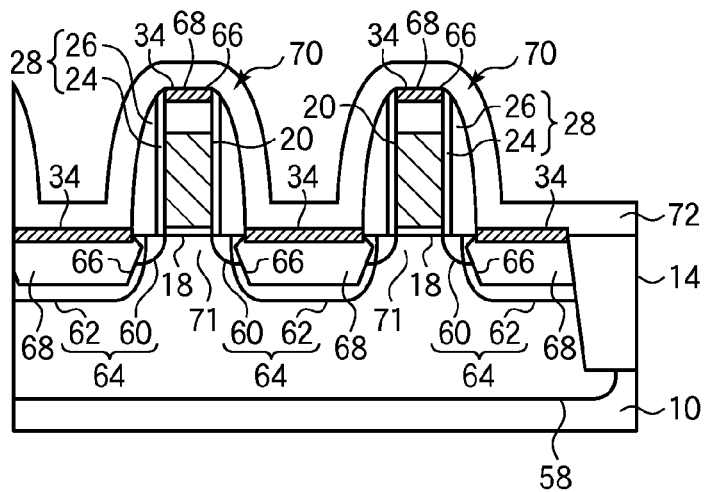
FIGS. 34A to 38 are cross-sectional views of a semiconductor device in the steps of the semiconductor device manufacturing method according to a sixth embodiment, which illustrate the method.
Figure 34B:
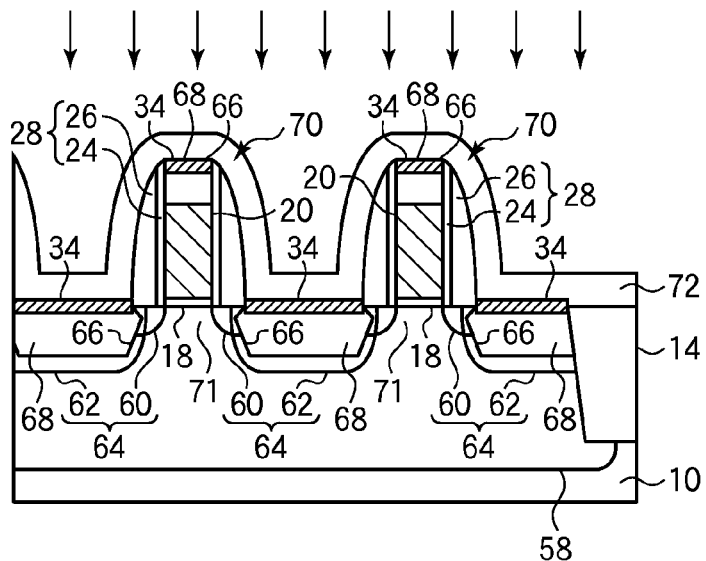
Figure 34C:
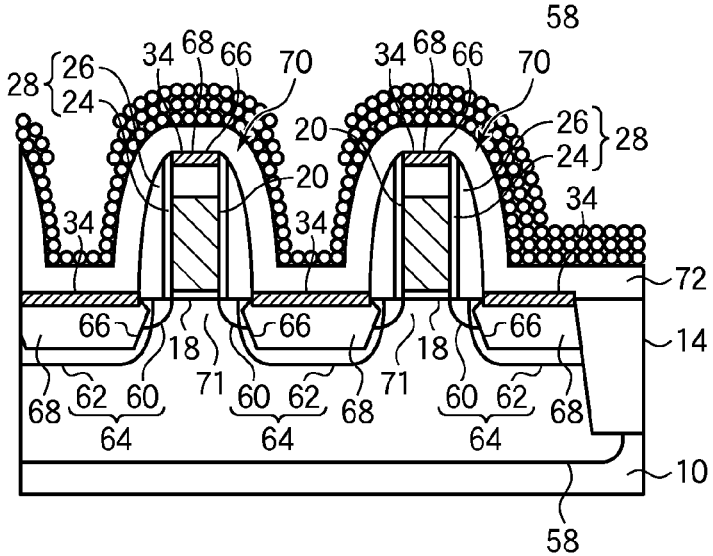
Figure 35A:
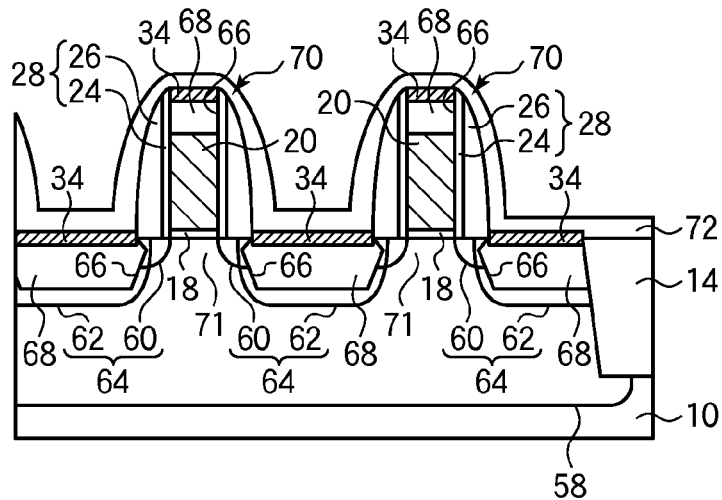
Figure 35B:
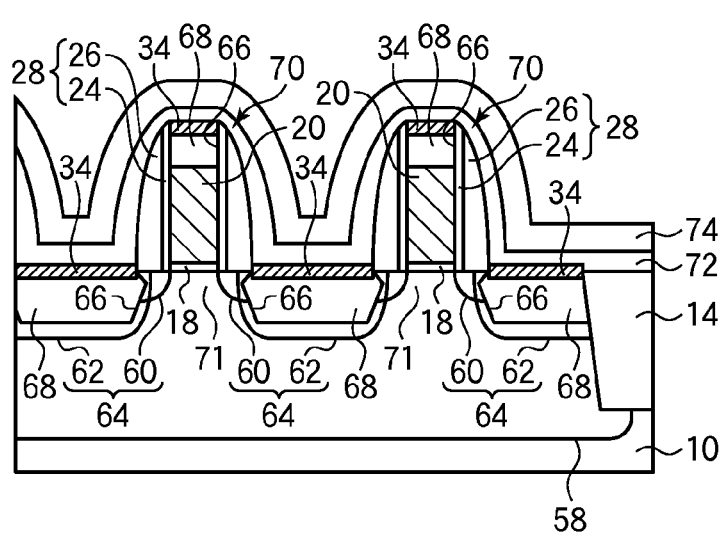
Figure 35C:
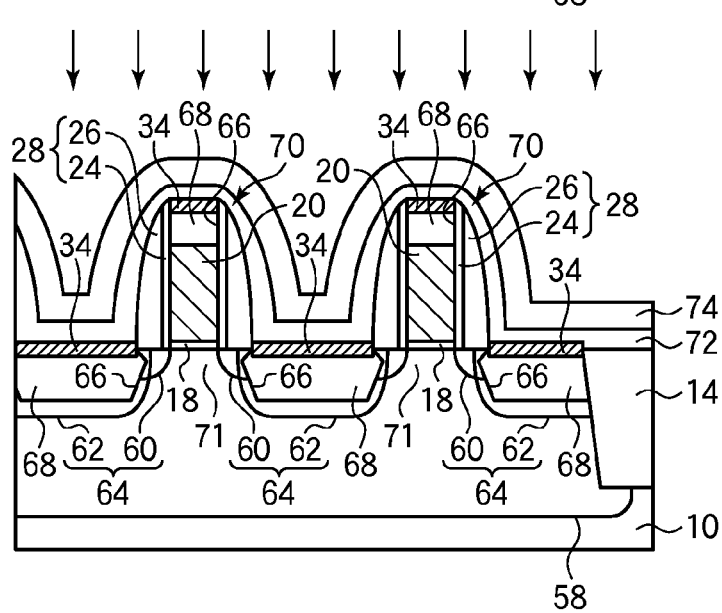
Figure 36A:
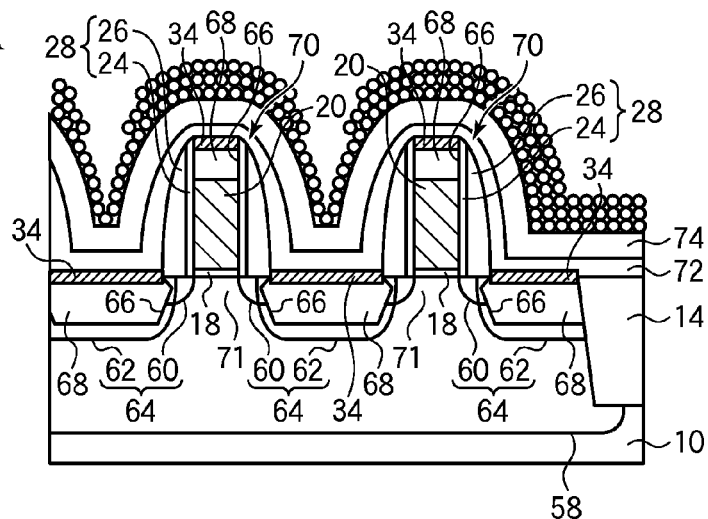
Figure 36B:
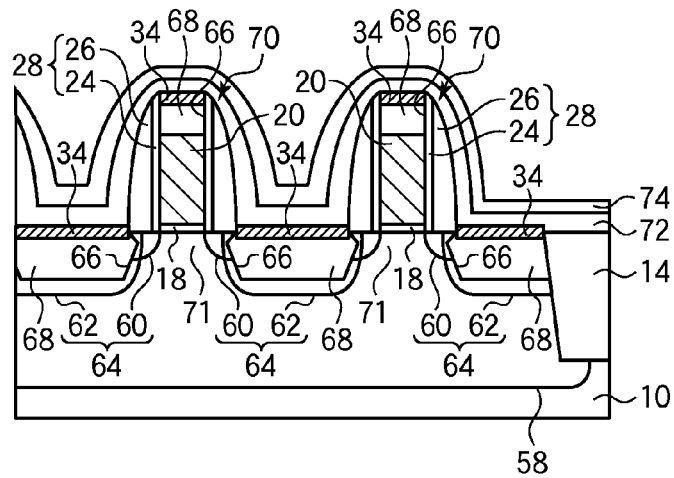
Figure 36C:
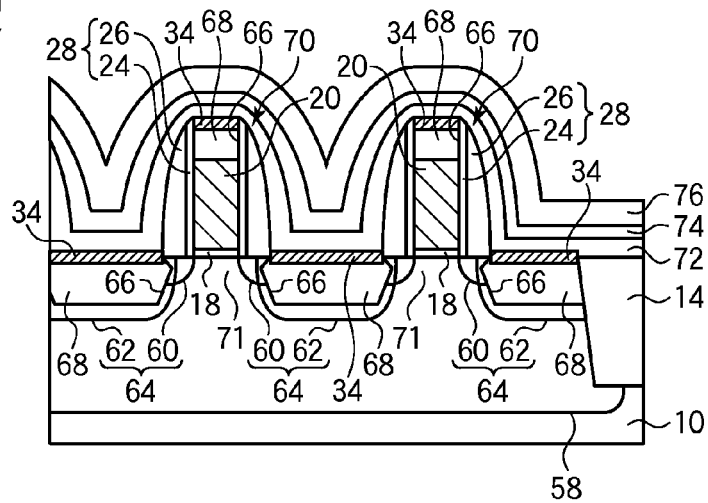

The process of the semiconductor device manufacturing method which follows hereafter is the same as that of the semiconductor device manufacturing method according to the fourth embodiment described above with reference to FIGS. 24C and 25, and the description will not be repeated (see FIG. 32C and 33).

As described above, not only the first silicon nitride film 72 but also the second silicon nitride film 74 may be etched back with NH$_4$F radicals.

[f] A Sixth Embodiment

The semiconductor device manufacturing method according to a sixth embodiment will be described with reference to FIGS. 34A to 38. FIGS. 34A to 38 are cross-sectional views of the semiconductor device in the steps of the semiconductor device manufacturing method according to the present embodiment, which illustrate the method. The same members of the present embodiment as those of the semiconductor device manufacturing method according to the first to the fifth embodiments illustrated in FIGS. 1A to 33 are represented by the same reference numbers not to repeat or to simplify their description.

The semiconductor device manufacturing method according to the present embodiment is characterized mainly in that not only the first silicon nitride film 72 and the second silicon nitride film 74 but also the third silicon nitride film 76 is etched back with NH$_4$F radicals.

First, the step of forming the device isolation regions 14 in the semiconductor substrate 10 to the step of forming the silicon nitride film 74 are the same as those of the semiconductor device manufacturing method according to the fourth embodiment described above with reference to FIGS. 20A to 24B, and their description will not be repeated (see FIGS. 34A to 35A).

Then, the step of making oxygen plasma processing on the silicon nitride film 74 to the step of forming the silicon nitride film 76 is the same as the process of the semiconductor device manufacturing method according to the fifth embodiment described above with reference to FIGS. 31C to 32C. The step of making oxygen plasma processing on the silicon nitride film 74 to the step of forming the silicon nitride film 76 will not be described (see FIGS. 35C to 36C).

Figure 37A:
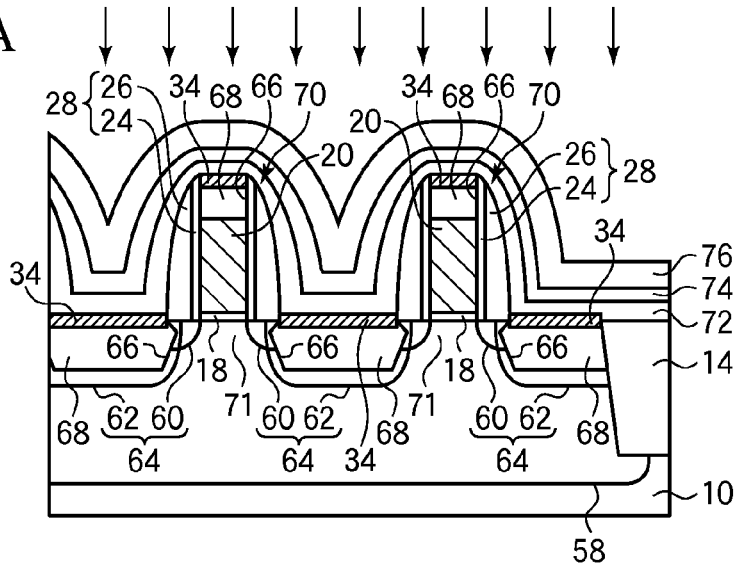

Next, in the same way as in the semiconductor device manufacturing method according to the fourth embodiment described above with reference to FIG. 23B, oxygen plasma processing is made on the silicon nitride film 76 (see FIG. 37A). The etched quantity of the silicon nitride film 76 by the oxygen plasma processing is, e.g., about 1-8 nm.

Figure 37B:
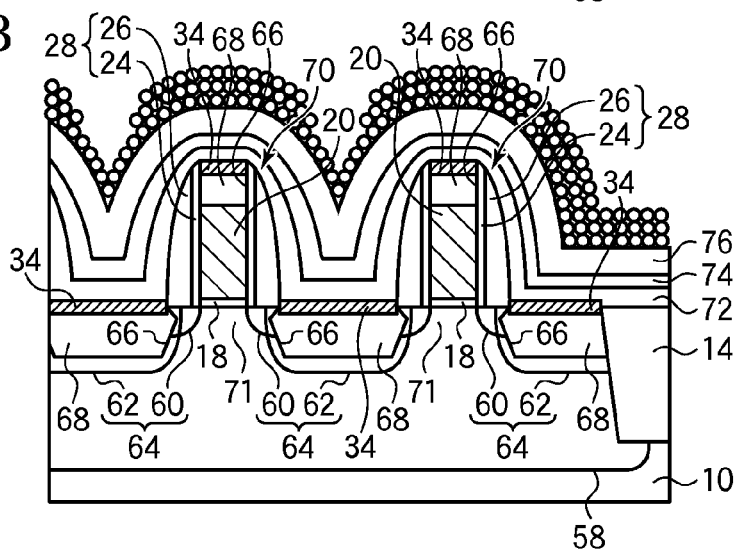

Then, in the same way as in the semiconductor device manufacturing method according to the fourth embodiment described above with reference to FIG. 23C, NH$_4$F radicals as the etchant are supplied to the silicon nitride film 76 (see FIG. 37B).

Figure 37C:
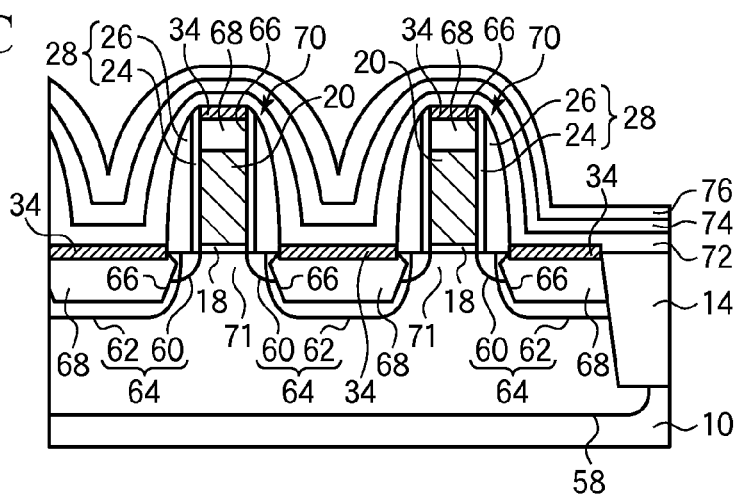

Then, in the same way as in the semiconductor device manufacturing method according to the fourth embodiment described above with reference to FIG. 24A, thermal processing is made on the silicon nitride film 76 to thereby etch back the silicon nitride film 76 (see FIG. 37C). To the parts of the silicon nitride film 76 positioned between the gate electrodes 20, a relatively small quantity of the etchant is supplied, and accordingly, the etched quantity of the silicon nitride film 76 becomes relatively small. On the other hand, to the parts of the silicon nitride film 76 other than the parts positioned between the gate electrodes 20, a relatively large quantity of the etchant is supplied, and accordingly, the silicon nitride film 76 is etched relatively large. Thus, the silicon nitride film 76 resides with the film thickness of the silicon nitride film 76 decreasing gradually from the tops of the source/drain diffused layers 32 positioned between the gate electrodes 20 toward the tops of the gate electrodes 20. Accordingly, the inclination of the surface of the silicon nitride film 76 becomes relatively blunt at the parts where the gate electrodes 20 are adjacent to each other. This contributes to preventing the generation of voids between the adjacent gate electrodes 20 when the silicon nitride film 78 is formed in a later step. No voids are formed in the silicon nitride film 76 in the thus etched-back silicon nitride film 76 itself.

Thus, the etch-back is made on the silicon nitride film 76. Such etch-back etches back the silicon nitride film 76 on the gate electrodes 20 by, e.g., about 5-35 nm. The film thickness of the silicon nitride film 76 after etched back becomes, e.g., about 10-40 nm.

When the film thickness of the silicon nitride film 76 on the gate electrodes 20 becomes excessively small, sufficient compressive stresses cannot be applied to the channel regions 71 of the PMOS transistors 70. Accordingly, it is preferable that the film thickness of the silicon nitride film 76 on the gate electrodes 20 is not excessively small. Specifically, the film thickness of the silicon nitride film 76 after etched back is preferably, e.g., 5-15 nm.

Figure 38:
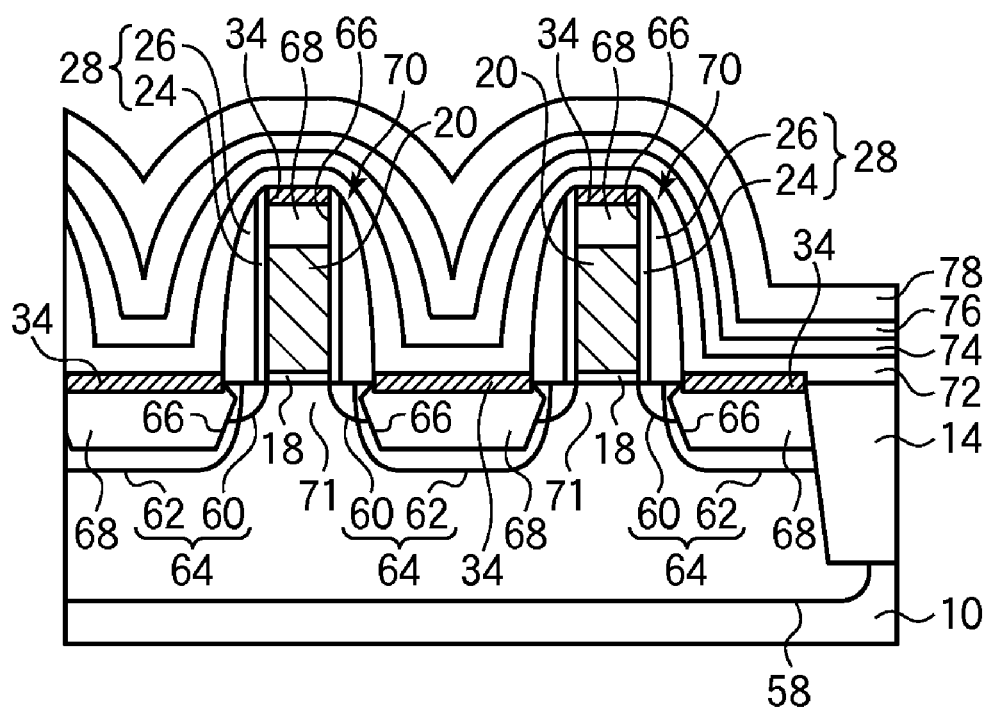

The process of the semiconductor device manufacturing method, which follows hereafter is the same as that of the semiconductor device manufacturing method according to the fourth embodiment described above with reference to FIG. 25, and its description will not be repeated (see FIG. 38).

As described above, not only the first silicon nitride film 72 and the second silicon nitride film 74 but also the third silicon nitride film 76 may be etched back with $NH_4F$ radicals.

Modified Embodiments

The present invention is not limited to the above-described embodiments and can cover other various modifications.

For example, in the above-described embodiments, the number of the silicon nitride film is four, but the number is not limited to four. The number of the silicon nitride film may be three or less. In order to further improve the reliability, the number of the silicon nitride film may be five or more.

In the second or the third embodiments, the silicon nitride film 38 may be etched back separately twice. In the second or the third embodiments, the silicon nitride film 40 may be etched back separately twice. In the third embodiment, the silicon nitride film 42 may be etched back separately twice.

In the fifth or the sixth embodiments, the silicon nitride film 72 may be etched back separately twice. In the fifth or the sixth embodiment, the silicon nitride film 74 may be etched back separately twice. In the sixth embodiment, the silicon nitride film 76 may be etched back separately twice.

In the fourth to the sixth embodiments, oxygen plasma processing is made on the silicon nitride films 72, 74, 76, but the processing is not limited to oxygen plasma processing. Plasma processing with other plasmas can improve the etching rate of the silicon nitride films 72, 74, 76. The plasma processing may be made with, e.g., $CF_4$ plasma or $N_2O$ plasma.

The modification of the fourth embodiment has been described by an example that oxygen plasma processing is made after the silicon nitride film 72 has been etched back and before $NH_4F$ radicals are supplied to the silicon nitride film 72 (see FIG. 27B). Such oxygen plasma processing may not be made. Because of the oxygen plasma processing has been already made on the silicon nitride film 72 before the first etch-back is made on the silicon nitride film 72 (see FIG. 26B), the second etch-back on the silicon nitride film 72 can be made at a relatively high etching rate even without the second oxygen plasma processing on the silicon nitride film 72.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:
   forming a transistor over a semiconductor substrate;
   forming a first silicon nitride film covering the transistor over the semiconductor substrate;
   supplying a $NH_4F$ radical to the first silicon nitride film;
   making thermal processing on the first silicon nitride film after the supplying the $NH_4F$ radical; and
   forming a second silicon nitride film over the first silicon nitride film after the thermal processing.

2. A semiconductor device manufacturing method according to claim 1, further comprising, after the forming the first silicon nitride film and before the supplying the $NH_4F$ radical to the first silicon nitride film,
   making plasma processing on the first silicon nitride film.

3. A semiconductor device manufacturing method according to claim 2, wherein
   in the plasma processing, oxygen plasma processing is made.

4. A semiconductor device manufacturing method according to claim 1, further comprising, after the thermal processing on the first silicon nitride film and before the forming the second silicon nitride film,
   making UV cure on the first silicon nitride film.

5. A semiconductor device manufacturing method according to claim 1, further comprising, after the thermal processing on the first silicon nitride film and before the forming the second silicon nitride film:
   supplying a $NH_4F$ radical to the first silicon nitride film; and
   further making thermal processing on the first silicon nitride film.

6. A semiconductor device manufacturing method according to claim 1, further comprising after the forming the second silicon nitride film:
   supplying the $NH_4F$ radical to the second silicon nitride film; and
   making thermal processing on the second silicon nitride film.

7. A semiconductor device manufacturing method according to claim 1, wherein
   in the supplying the $NH_4F$ radical to the first silicon nitride film, the $NH_4F$ radical is produced in a plasma chamber positioned at a place remote from the semiconductor substrate.

8. A semiconductor device manufacturing method according to claim 7, wherein
   in the supplying the $NH_4F$ radical to the first silicon nitride film, $NF_3$ gas and $NH_3$ gas are fed into the plasma chamber.

9. A semiconductor device manufacturing method according to claim 1, wherein
   in the thermal processing on the first silicon nitride film, the first silicon nitride film is heated to 100° C. or above.

10. A semiconductor device manufacturing method according to claim 1, wherein
    in the supplying the $NH_4F$ radical to the first silicon nitride film, the $NH_4F$ radical is supplied to the first silicon nitride film through a shower head;
    in the thermal processing on the first silicon nitride film, the shower head heated and the first silicon nitride film are approached to thereby make thermal processing on the first silicon nitride film.

11. A semiconductor device manufacturing method according to claim 1, wherein
    a temperature of the semiconductor substrate in the supplying the $NH_4F$ radical to the first silicon nitride film is room temperature to 100° C.

* * * * *